(12) United States Patent
Shishido et al.

(10) Patent No.: US 9,671,223 B2
(45) Date of Patent: Jun. 6, 2017

(54) PATTERN DIMENSION MEASUREMENT METHOD USING ELECTRON MICROSCOPE, PATTERN DIMENSION MEASUREMENT SYSTEM, AND METHOD FOR MONITORING CHANGES IN ELECTRON MICROSCOPE EQUIPMENT OVER TIME

(75) Inventors: Chie Shishido, Kawasaki (JP); Maki Tanaka, Tokyo (JP); Katsuhiro Sasada, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 847 days.

(21) Appl. No.: 13/807,281

(22) PCT Filed: May 20, 2011

(86) PCT No.: PCT/JP2011/002807
§ 371 (c)(1),
(2), (4) Date: Mar. 14, 2013

(87) PCT Pub. No.: WO2012/014356
PCT Pub. Date: Feb. 2, 2012

(65) Prior Publication Data
US 2013/0166240 A1 Jun. 27, 2013

(30) Foreign Application Priority Data
Jul. 28, 2010 (JP) .................................. 2010-168804

(51) Int. Cl.
*G01B 15/04* (2006.01)
*G01Q 40/00* (2010.01)
(Continued)

(52) U.S. Cl.
CPC .............. *G01B 15/04* (2013.01); *G01Q 40/00* (2013.01); *H01J 37/263* (2013.01); *H01J 37/28* (2013.01);
(Continued)

(58) Field of Classification Search
CPC ....... G01N 23/2251; H01J 2237/24578; G06T 7/001
See application file for complete search history.

(56) References Cited

U.S. PATENT DOCUMENTS

| 4,264,822 A | 4/1981 | Ueno et al. |
| 2005/0247860 A1 | 11/2005 | Shishido et al. |

(Continued)

FOREIGN PATENT DOCUMENTS

| JP | 55-72807 A | 6/1980 |
| JP | 11-316115 A | 11/1999 |

(Continued)

OTHER PUBLICATIONS

"Chapter 1: Shape Observation—Directed at 3D Measurement"; Corporate Juridical Person, Semiconductor Manufacture Equipment Association of Japan (SEAJ), Hei-17, Semiconductor manufacture equipment technology road map report, 5-th edition measurement, Mar. 18, 2006. (Fifteen (15) pages).

(Continued)

*Primary Examiner* — Gregory J Toatley
*Assistant Examiner* — Kyle R Quigley
(74) *Attorney, Agent, or Firm* — Crowell & Moring LLP

(57) ABSTRACT

Beforehand, the device characteristic patterns of each critical dimension SEM are measured, a sectional shape of an object to undergo dimension measurement is presumed by a model base library (MBL) matching system, dimension measurements are carried out by generating signal waveforms through SEM simulation by inputting the presumed
(Continued)

sectional shapes and the device characteristic parameters, and differences in the dimension measurement results are registered as machine differences. In actual measurements, from the dimension measurement results in each critical dimension SEM, machine differences are corrected by subtracting the registered machine differences. Furthermore, changes in critical dimension SEM's over time are monitored by periodically measuring the above-mentioned device characteristic parameters and predicting the above-mentioned dimension measurement results. According to the present invention, actual measurements of machine differences, which require considerable time and effort, are unnecessary. In addition, the influence of changes in samples over time, which is problematic in monitoring changes in devices over time, can be eliminated.

8 Claims, 17 Drawing Sheets

(51) Int. Cl.
*H01J 37/26* (2006.01)
*H01J 37/28* (2006.01)
(52) U.S. Cl.
CPC . *H01J 2237/22* (2013.01); *H01J 2237/24514* (2013.01); *H01J 2237/24578* (2013.01); *H01J 2237/2823* (2013.01); *H01J 2237/2826* (2013.01)

(56) References Cited

U.S. PATENT DOCUMENTS

| | | | |
|---|---|---|---|
| 2006/0091309 A1 | 5/2006 | Oosaki et al. | |
| 2007/0114405 A1 | 5/2007 | Oosaki et al. | |
| 2007/0187595 A1* | 8/2007 | Tanaka | G01N 23/2251 250/307 |
| 2008/0076046 A1* | 3/2008 | Willis | G01N 21/4788 430/30 |
| 2009/0212212 A1* | 8/2009 | Shishido | G03F 1/0092 250/307 |

FOREIGN PATENT DOCUMENTS

| | | |
|---|---|---|
| JP | 2005-322423 A | 11/2005 |
| JP | 2006-153837 A | 6/2006 |
| JP | 2007-122995 A | 5/2007 |
| JP | 2007-218711 A | 8/2007 |

OTHER PUBLICATIONS

International SEMATECH Manufacturing Initiative, "Unified Advanced Critical Dimension Scanning Electron Microscope (CD-SEM) Specification for sub-90 nm Technology (2008) Version," ISMI Technology Transfer #04114595E-ENG, 2009 International Sematech Manufacturing Initiative, Inc. (Eighty-nine (89) pages).
International Search Report dated Jun. 28, 2011 (Two (2) pages).
J.S. Villarrubia et al., "Scanning Electron Microscope Analog of Scatterometry", National Institute of Standards and Technology, Gaithersburg, MD, USA, Proceedings of SPIE, 2002, vol. 4689, pp. 304-312.

* cited by examiner

FIG. 17
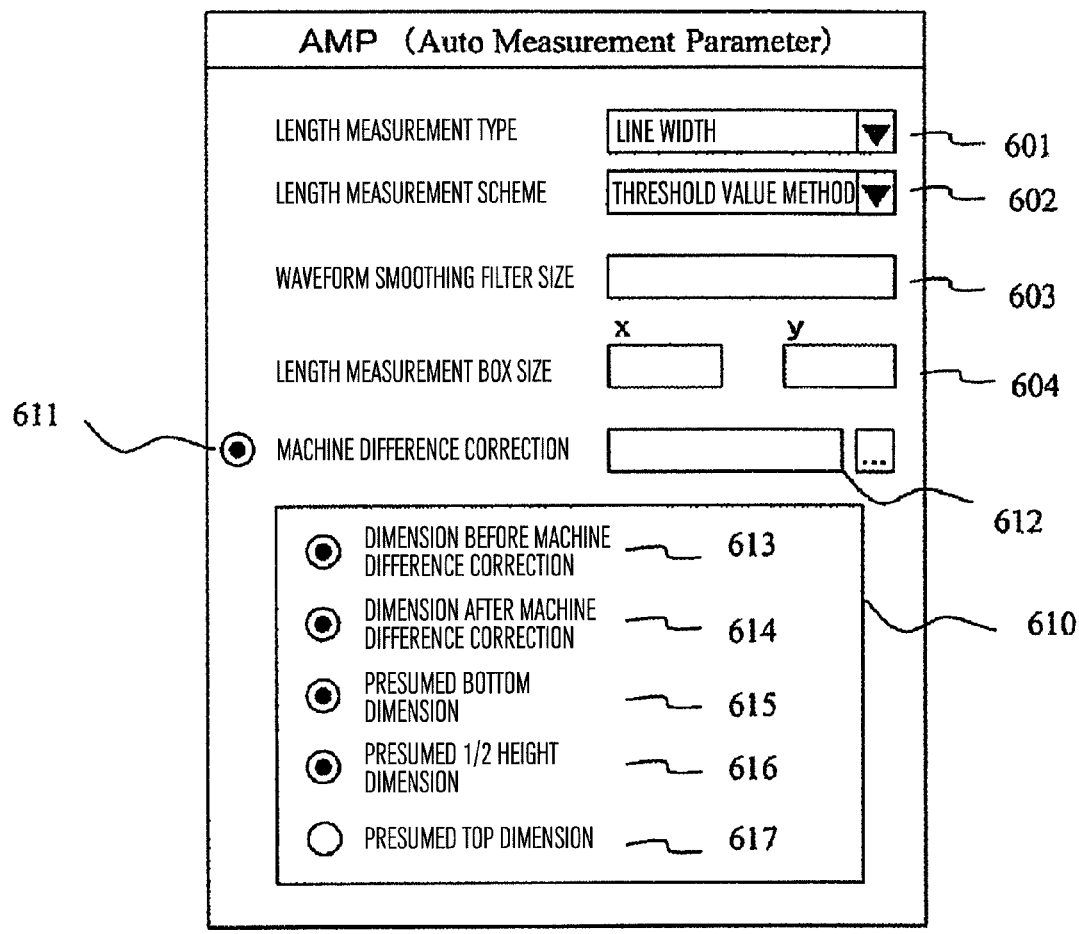
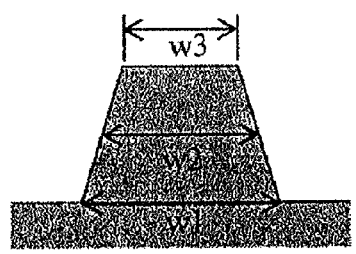

PATTERN DIMENSION MEASUREMENT METHOD USING ELECTRON MICROSCOPE, PATTERN DIMENSION MEASUREMENT SYSTEM, AND METHOD FOR MONITORING CHANGES IN ELECTRON MICROSCOPE EQUIPMENT OVER TIME

TECHNICAL FIELD

The present invention relates to pattern dimension measurement by an electron microscope used for measurement of a critical dimension in a semiconductor device and so on.

BACKGROUND ART

As described in non patent literature 1, a scanning electron microscope (hereinafter abbreviated as SEM) is specified to a critical dimension or length measurement SEM which is dedicated to the semiconductor measurement while enjoying widespread use as a pattern dimension managing tool in the semiconductor process. The principle of the length measurement SEM is illustrated in FIG. 2. An electron beam 910 emitted from an electron gun 901 is converged by means of a condenser lens 902 and while being focused on the surface of a sample 900 by means of an objective lens 904, the electron beam is scanned two-dimensionally on the sample 900 with the help of a deflector 903 controlled by a controller 906. By capturing secondary electrons 920 given off from the sample 900 under irradiation of the electron beam 910 with the help of a detector 905 and causing them to undergo signal processing, an electron beam image as displayed on a CRT 907 can be obtained. Since the secondary electrons are generated more abundantly at a pattern edge portion, the image of electron beam results in a picture having a bright portion corresponding to the pattern edge as displayed on the CRT 907. In the length measurement SEM, the dimension can be determined as (1×p) by multiplying an inter-edge distance 1 (pixels) by a pixel size p (nm/pixel) on the electron beam image.

An example of length measurement process in the length measurement SEM is described in patent literature 1. In the example disclosed by the patent literature 1, from a local area inside an image resulting from image-picking up a measurement objective wiring conductor, a projective waveform is prepared which is obtained by adding and averaging signal waveforms on the wiring conductor in the longitudinal direction of the wiring conductor, and the dimension of wiring conductor is calculated as a distance between the bilateral wiring conductor edges which is detected in the projective waveform.

Out of a variety of methods proposed as methods of detecting edge positions for the sake of the automatic calculation of inter-edge distance 1, a threshold value method widely used in general will be described hereunder.

The threshold value method is disclosed in, for example, patent literature 2. As shown in FIG. 3, peak portions of large signal amounts corresponding to bilateral pattern edges will be called a left white band (left WB) and a right white band (right WB), respectively. In the threshold value method, a Max value and a Min value are determined at each of the right and left WB's, a threshold level which divides internally the Max and Min values at a predetermined ratio th (%) is calculated and a crossing point of the threshold value and a signal waveform is defined as an edge position.

With a semiconductor device pattern rendered corpuscular, the demand for measurement accuracy is becoming stringent year by year. In the case of the length measurement SEM, a plurality of length measurement SEM's are thrown into one semiconductor fabrication line and they are often used in combination and accordingly, not only the measurement reproducibility of a single length measurement SEM but also the measurement reproducibility between devices, that is, differences among measurement values of the plural length measurement SEM's (hereinafter referred to as machine differences) come into question. The machine difference is demanded to be less than 0.18 nm for DRAM half pitch 45 nm generation, less than 0.13 nm for DRAM half pitch 32 nm generation and less than 0.09 nm for DRAM half pitch 22 nm generation, as exemplarily described in the non patent literature 2.

The non patent literature 2 also discloses a method for measuring the machine difference. As described above, differences in measured values among the plural SEM's are defined as the machine differences but in the length measurement SEM, a sample is caused to change by undergoing contamination due to electron beam irradiation (a phenomenon in which an amorphous carbon film is deposited on a portion of the sample irradiated with the electron beam), sample electrification or shrink (shrinkage of a resist pattern due to electron beam irradiation), with the result that even when the same measurement objective is measured with the plural devices and differences among the measured values are simply determined, the machine difference cannot be said as being measured correctly. This is because the difference between measured values is inevitably affected by the change in sample. The non patent literature 2 shows a concrete method for dealing with the problem as above. Two typical expedients, namely, an ABBA method and a grating method will be described hereinafter.

(1) ABBA Method

Defined are a machine difference $\delta$ (nm) between devices B and A, a measurement value change amount c1 (nm) due to contamination, sample electrification and shrink caused by measurement in a device A and a measurement value change amount c2 (nm) caused by measurement in a device B. The machine difference is determined through steps 1 to 3 as described in the following.

Step 1: In respect of a plurality of spots (usually, several of tens of spots) on the sample, measurement is conducted with the use of device A, followed by measurement with the use of device B (AB sequence) and an average of values measured by the device A is subtracted from an average of values measured by the device B to obtain a value $\delta 1$ (nm). The relation is held among $\delta$, $\delta 1$ and c1 as expressed by a mathematical expression 1.

$$\delta 1 = \delta + c1 \quad \text{(MATH. 1)}$$

Step 2: In respect of a plurality of spots (usually, several of tens of spots) on the sample, measurement is conducted with the use of device B, followed by measurement with the use of device A (BA sequence) and an average of values measured by the device B is subtracted from an average of values measured by the device A to obtain a value $\delta 2$ (nm). The relation is held among $\delta$, $\delta 2$ and c2 as expressed by a mathematical expression 2.

$$\delta 2 = -\delta + c2 \quad \text{(MATH. 2)}$$

Step 3: Assuming that c1=c2 stands (changes in sample caused by each of the devices A and B are substantially identical), from mathematical expressions 1 and 2, $\delta$ can be determined by $$\delta = (\delta 1 - \delta 2)/2 \quad \text{(MATH. 3)}$$

According to the ABBA method, a correct machine difference can be obtained when the assumption of c1=c2 stands (indicating that changes in sample caused by the respective devices A and B are deemed to be substantially identical) and the number of measurement spots is large enough by taking measurement errors in individual measurements into consideration.

(2) Grating Method

In the grating method, for the sake of avoiding the influence the changes in sample due to the electron beam irradiation, the same spot is not measured plural times but locations of measurement spots during measurement of machine differences among four devices (A, B, C, D) are displaced from one another so that each device may measure many fresh spots (spots not image-picked up even once) of each of the devices and a difference between averages may be defined as a machine difference.

In this case, with a view to permitting a distribution of completed patterns on plane to hardly have an influence upon measurement spots, the individual devices have measurement spots which are so arranged as not to localize.

CITATION LIST

Patent Literature

Patent literature 1: JP-A-11-316115
Patent literature 2: JP-A-55-72807

Non Patent Literature

Non patent literature 1: Corporate Juridical Person, Semiconductor Manufacture Equipment Association of Japan (SEAJ), Hei-17, Semiconductor manufacture equipment technology road map report, 5-th edition measurement
Non patent literature 2: International SEMATECH Manufacturing Initiative, "Unified Advanced Critical Dimension Scanning Electron Microscope (CD-SEM) Specification for sub-90 nm Technology (2008) Version," ISMI Technology Transfer #04114595E-ENG

SUMMARY OF INVENTION

Technical Problem

While individual critical dimension SEM vendor companies are continuing to make efforts to reduce the machine difference for the sake of responding to the demand associated with the aforementioned machine difference, various types of devices coexist depending on running conditions of the critical dimension SEM's and differences in performance (for example, differences in resolution) prevail among the types, giving rise to inevitable generation of machine differences. As countermeasures thereagainst, a method is sometimes adopted according to which, before proceeding with the actual measurement, real machine differences are measured and registered as machine differences differing from device to device (according to the ABBA method or grating method) and upon actual measurement, the machine differences differing from device to device are subtracted from the dimension measurement values of the individual devices so as to correct the machine difference (hereinafter referred to as machine difference real measurement method).

In the ABBA method, however, for the case of three objective devices (A, B, C), for example, procedures are needed for measuring a machine difference between devices A and B in accordance with the ABBA sequence and further measuring a machine difference between devices A and C in accordance with the ACCA sequence, thus requiring much labor and time for the measurement of machine difference. In addition, in the grating method, when the measurement spots are not localized, the influence the edge roughness has remains to make the pattern dimension different depending on locations and therefore, in order to prevent the machine difference from being buried in the pattern dimension difference, the number of measurement spots must be increased considerably (though depending on the degree of edge roughness). The grating method is advantageous in that it can be applicable even in the event that the prepositional condition c1=c2 in ABBA method does not stand but, differing from the ABBA method, the dimension differences depending on locations have direct influence upon the grating method in contrast to the ABBA method and therefore, in principle, a far larger number of measurement spots are needed in the grating method than in the ABBA method. In FIG. 4, the number of measuring spots amounts up to 25 in each of the devices but when taking the requirement for the dealing with the aforementioned machine difference into consideration, measurement spots amounting in number up to 100 or more will not seldom be needed.

As described above, in any of the ABBA method and grating method, much labor and time is needed for machine difference measurement and besides, such an error factor as sample change and such an error factor as pattern edge roughness are present in the ABBA method and the grating method, respectively, so that correct measurement of machine difference cannot always be achievable.

Further, the machine difference differs depending on the sectional shape (such as defined by height, sidewall inclination angle or the like) of a measurement objective and the pattern density, thus giving rise to a very troublesome problem that in trying to stringently apply the machine difference actual measurement scheme, machine differences are required to be measured actually in respect of all measurement objective patterns. This arises from the fact that the machine difference is caused by differences in incident beam characteristics and secondary electron detection characteristics among the devices. Exemplarily, illustrated in FIGS. 6 to 8 are results of simulation of machine differences when various patterns 120, 121, 122 and 123 as shown in FIGS. 5A to 5D are measured by using two critical dimension SEM's having different beam diameters.

In the simulation, SEM signal waveforms in the case of the beam diameter being 5 nm (a Gaussian beam of $\sigma=2.5$ nm) and SEM signal waveforms in the case of the beam diameter being 6 nm (a Gaussian beam of $\sigma=3$ nm) are obtained through Monte Carlo simulation, each of the waveforms is applied with the threshold value method (see FIG. 3) to calculate dimensions and a difference between the measured dimension value in the case of the beam diameter being 6 nm and the measured dimension value in the case of the beam diameter being 5 nm is determined as a machine difference.

Designated by (a) in FIG. 6 are results of calculation of machine difference in respect of an isolated line pattern having a pattern height of 80 nm and a sidewall inclination angle of 0° (such a pattern 120 as shown in FIG. 5A) and designated by (b) in FIG. 6 are results of calculation of machine difference in respect of an isolated line pattern having a pattern height of 80 nm and a sidewall inclination angle of 10° (such a pattern 121 as shown in FIG. 5B) when the line width is changed from 15 nm to 45 nm. It will be seen from theses results that with the sidewall inclination angle differed, the machine difference differs. In order to apply the machine difference actual measurement scheme, machine differences are required to be measured actually in connection with different sidewall inclination angles.

Designated by (a) in FIG. 7 is the aforementioned curve at (a) in FIG. 6 and designated by (c) in FIG. 7 are results of calculation of machine differences in respect of a line and space pattern having a pattern height of 80 nm, a sidewall inclination angle of 0° and a pattern pitch of 45 nm (such a pattern 122 as shown in FIG. 5C). It will be seen from theses results that with the pattern density differed, the machine difference differs. To add, the machine difference at (a) slightly differs from that at (c) in the case of the line width being less than 25 nm because, in the present simulation, the pattern pitch in the line and space pattern is fixed to 45 nm and therefore, as the line width becomes small, the distance to an adjacent line increases and a condition close to the isolated line pattern takes place. Obviously, the tendency to change in machine difference differs depending on the line width and pattern pitch and therefore, in applying the machine difference actual measurement scheme, it is necessary to actually measure machine differences in respect of different pattern pitches and sizes.

Designated by (a) in FIG. 8 is the aforementioned curve at (a) in FIG. 6 and designated by (d) in FIG. 8 are results of calculation of machine difference in respect of an isolated space pattern having a pattern height of 80 nm and a sidewall inclination angle of 0° (such a pattern 123 as shown in FIG. 5D) when the line width is changed from 15 nm to 45 nm. The sign is inverted between the machine difference of line pattern at (a) and the machine difference of space pattern at (d). This is because, as shown in FIG. 9, a peak portion of secondary electron signal waveform spreads by a constant amount, establishing such a relation that an increased beam diameter results in an increased spread of the peak portion. Putting the space measurement aside, a condition similar to that at (d) takes place when the diameter of a hole pattern is measured. In this manner, the machine difference also differs depending on the topology of a measurement objective. In applying the machine difference actual measurement scheme, actually measuring the machine difference according to the topology is said to be necessary.

FIGS. 6 to 8 illustrate the results of simulation when the machine difference takes place owing to a difference in beam diameter between the devices whereas when another factor of machine difference, for example, a difference in tilt angle of an incident beam between devices or a difference in detection efficiency of secondary electrons between devices exists, the machine difference differs also depending on the sectional shape (as expressed by height, sidewall inclination angle or the like) of a measurement objective and the pattern density but the manner of differing has a tendency different from that of the aforementioned simulation results.

As will be seen from the above, the machine difference actual measurement method demands much labor and time even for a single pattern and besides, needs to deal with machine differences which are difficult to measure accurately in respect of individual measurement objective patterns and is therefore said to be hardly realistic under the condition that many and various measurement objective patterns prevail.

The present invention has for its object to provide a machine difference correction method, a pattern dimension measurement method and a pattern dimension measurement system which are applicable to such a case that for the reason of difference in type or the like, removal of machine differences is difficult to attain by adjusting hardware of the respective critical dimension SEM's and that the measurement objectives are so various that the device actual measurement method is difficult to deal with the removal, and to provide a method of monitoring secular changes in the pattern dimension measurement system and in an electron microscope device.

Solution to Problem

The outline of typical expedients disclosed in the present application will be explained in brief as below.

(1) In the present invention, the machine difference is corrected, that is, measured values devoid of machine difference can be obtained through the following steps (A) to (C):

(A) Step of modeling machine characteristics: In individual critical dimension SEM's (#1 device~#n device), device characteristic parameters are determined by image-picking up a dedicated sample and analyzing an image. For example, the following (a)~(c) are conducted.

(a) Beam diameter: A knife edge pattern is image-picked up and a beam diameter is calculated from the degree of blur of a peak waveform at an edge portion. (b) Beam tilt angle: A pyramid shape pattern (quadrangular prism shape pattern) is image-picked up and a beam tilt angle is calculated from a distortion of the pyramid shape pattern on an image. (c) Brightness conversion coefficient: By using a sample of known sectional shape (shape information is obtained by measurement with help of an inter-atomic force microscope or by sectional shape SEM observation), an SEM signal waveform at the sectional shape is obtained through SEM simulation and by comparing the thus determined waveform with a real signal waveform obtained by the critical dimension SEM, a brightness conversion coefficient between the simulation waveform and the real waveform can be calculated.

(B) Step of presuming machine difference: A measurement objective pattern is image-picked up with the help of a reference device (for example, critical dimension SEM #1 device) and a sectional shape of the measurement objective pattern is presumed through MBL method (model/base/library method, that is, a method of presuming a sectional shape of a sample by fitting an electron beam signal waveform for a measurement objective pattern to a precedently prepared library which is adapted for associating a sectional shape of the sample with an SEM signal waveform). By executing, through the use of input of the sectional shape, an SEM simulation upon which the device parameters (calculated in (A) above) are reflected, SEM signal waveforms of #2 device~#n device are obtained, dimension measurement is conducted by applying a predetermined edge detection method (aforementioned threshold value method or the like) and then, by comparing the thus measured dimension with the result of dimension measurement by the critical dimension SEM #1 device, a machine difference from the reference machine the individual critical dimension SEM's have is presumed.

(C) Step of length measurement: Measurement of a measurement objective pattern is carried out in an ordinary fashion with the help of the individual critical dimension SEM's (#1 device~#n device) and in respect of the non-reference devices (#2 device~#n device), the machine difference presumed in the above (B) is subtracted from the obtained measurement result.

While, in the case of the machine difference actual measurement method representing the conventional method, the machine difference measurement demanding much labor and time and encountering difficulties in correct measurement must be carried out in respect of all measurement objective patterns, the machine difference can be presumed in the step of (B) above according to the present invention when the machine characteristic parameters are measured in advance in the step of (A) above.

In addition, according to the present invention, by using the machine difference presumed in (B) above as a correction value, a machine difference correction method can be provided which is applicable to such a case that many and various measurement objectives prevail. Through this, even when critical dimension SEM's of different types coexist, these devices can be used in a mingled fashion.

(2) A pattern dimension measurement method comprises the steps of: scanning a dimension measurement objective sample by using a first electron microscope device representing one of a plurality of electron microscope devices mutually coupled through a network so as to acquire an image of a pattern of the dimension measurement objective sample; comparing a real signal waveform of the captured image of a pattern of the dimension measurement objective sample with a simulation waveform library prepared through simulation by using device characteristic parameters of the first electron microscope device out of device characteristic parameters of the plurality of electron microscope devices which are stored in advance so as to obtain an presumed sectional shape of the pattern of the dimension measurement objective sample; generating a plurality of artificial signal waveforms corresponding to individual plural electron microscope devices exclusive of the first electron microscope by using the thus obtained presumed sectional shape of the dimension measurement objective sample and device characteristic parameters corresponding to individual plural electron microscope devices exclusive of the first electron microscope among the plurality of electron microscope devices; calculating machine differences among individual plural electron microscope devices inclusive of the first electron microscope by using the dimension of pattern of the dimension measurement objective sample calculated on the basis of the real signal waveform and plural dimensions of pattern of the dimension measurement objective sample calculated on the basis of individual plural artificial signal waveforms so as to store, as machine difference information, the calculated machine differences among the individual plural electron microscope devices in a machine difference database, and correcting the dimension measurement result of pattern of the dimension measurement objective sample obtained through the use of at least one of the plural electron microscope devices by using the machine difference information stored in the machine difference database so as to measure a dimension of the pattern of the dimension measurement objective sample.

(3) A pattern dimension measurement system comprises: a plurality of electron microscope devices mutually coupled through a network; a device parameter database for storing device parameters of each of the plural electron microscope devices; a computer which compares a real signal waveform of a pattern of a dimension measurement objective sample obtained by scanning the dimension measurement objective sample through the use of a first electron microscope device representing one of the plural electron microscope devices with a simulation waveform library prepared through simulation by using device characteristic parameters of the first electron microscope device stored in the device parameter database so as to obtain an presumed sectional shape of the pattern of the dimension measurement objective sample, and generates a plurality of artificial signal waveforms corresponding to the individual plural electron microscope devices exclusive of the first electron microscope device by using the thus obtained presumed sectional shape of the dimension measurement objective sample and machine characteristic parameters of the individual plural electron microscope devices exclusive of the first electron microscope device; a machine difference database which stores, as machine difference information, the machine differences among the plurality of electron microscope devices inclusive of the first electron microscope calculated on the basis of dimensions of the patterns of the plural dimension measurement objective samples calculated on the basis of each of the plural artificial signal waveforms generated by the computer and also on the basis of dimensions of the pattern of the dimension measurement objective samples calculated on the basis of the actual signal waveform; and a recipe database stored with a recipe including a process for correcting the dimension measurement result by using the machine difference information stored in the machine difference database.

(4) A method of monitoring secular changes in an electron microscope device comprises the steps of: calculating periodically or non-periodically device characteristic parameters by using a pattern image obtained by image-picking up a sample for evaluating device characteristics with the help of the electron microscope device; storing the measured device characteristic parameters in a database by linking them to dates and times of calculation; comparing a real signal waveform of a pattern image of the device characteristic evaluation sample with a simulation waveform library prepared through the use of the device characteristic parameters so as to obtain a presumed sectional shape of the pattern of the device characteristics evaluation sample; generating an artificial signal waveform by using the presumed sectional shape of device characteristic parameters and the device characteristic parameters; performing dimension measurement of the pattern of device characteristics evaluation sample by using the generated artificial signal waveform and storing results of the dimension measurement; and displaying the stored dimension measurement results together with secular changes in the device characteristics parameters.

(5) A method of correcting machine differences uses (a1) a plurality of electron microscope devices, (b1) a system for measuring device characteristic parameters of each of the electron microscope devices, (c1) a database for storing machine characteristic parameters of the individual electron microscope devices, (d1) a system for estimating a sectional shape of a sample, (e1) a system for generating an artificial SEM signal waveform of each of the electron microscope devices from the presumed sectional shape of the sample and machine characteristic parameters of each electron microscope device and (f1) a database for storing differences among dimension measurement results resulting from dimension measurement of the artificial SEM signal waveforms, thereby correcting dimension measurement results in the plural electron microscope devices by consulting the database adapted to store differences in dimension measurement results among the artificial SEM signal waveforms.

(6) A method of monitoring secular changes in an electron microscope device uses (a2) an electron microscope device, (b2) a system for measuring device characteristic parameters of the electron microscope device, (c2) a database for storing the device characteristic parameters by linking them to dates and times of calculation of the machine characteristic parameters, (d2) a system for estimating a sectional shape of a sample, (e2) a system for generating an artificial SEM signal waveform from the presumed sectional shape of the sample and the device characteristic parameters of the electron microscope device and (f2) a database for storing measured dimensions resulting from execution of measurement of dimensions of the artificial SEM signal waveform, thereby totally carrying out steps in the (b2), (c2), (d2), (e2) and (f2) to offer secular changes in device characteristic parameters together with dimension measurement results.

Advantageous Effects of Invention

According to the present invention, a machine difference correction method, a pattern dimension measurement method and a pattern dimension measurement system can be provided which are applicable to such a case that for the reason of difference in type or the like, removal of machine differences is difficult to attain by adjusting hardware of the respective critical dimension SEM's and that the measurement objectives are so various that the machine difference actual measurement method is difficult to deal with the removal, and a method of monitoring secular changes in the pattern dimension measurement system and in an electron microscope device can also be provided.

FIG's. 5A to 5D are diagrams illustrative of various measurement objectives.

Figure 6:
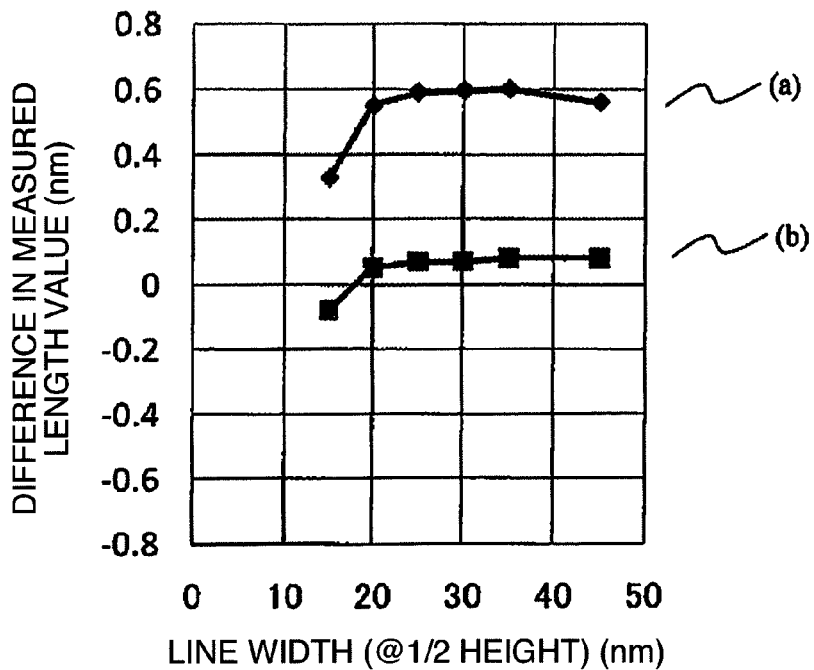

FIG. 6 is a graph for explaining the relation between a difference in sidewall inclination angle and a machine difference.

Figure 7:
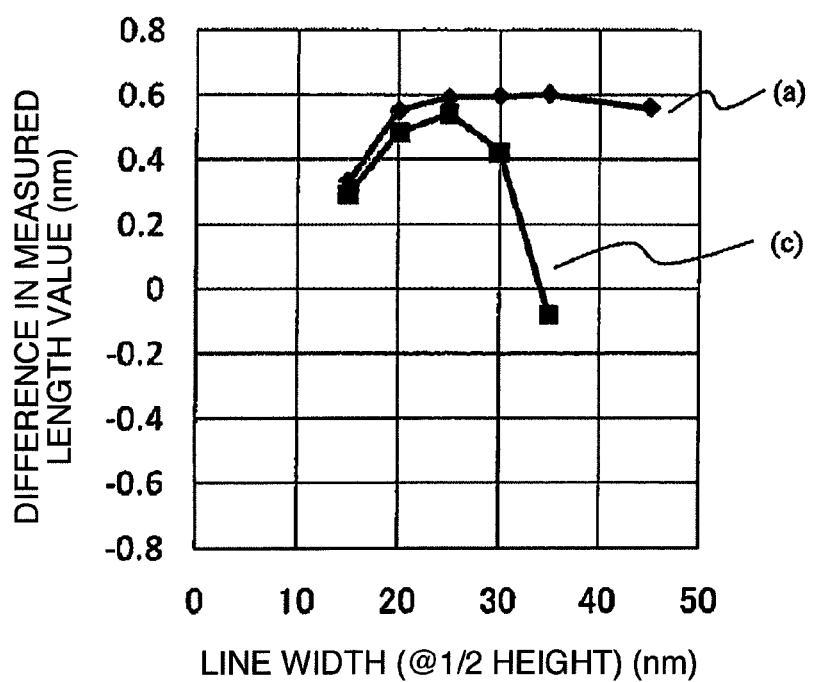

FIG. 7 is a graph for explaining the relation between a difference in pattern density and a machine difference.

Figure 8:
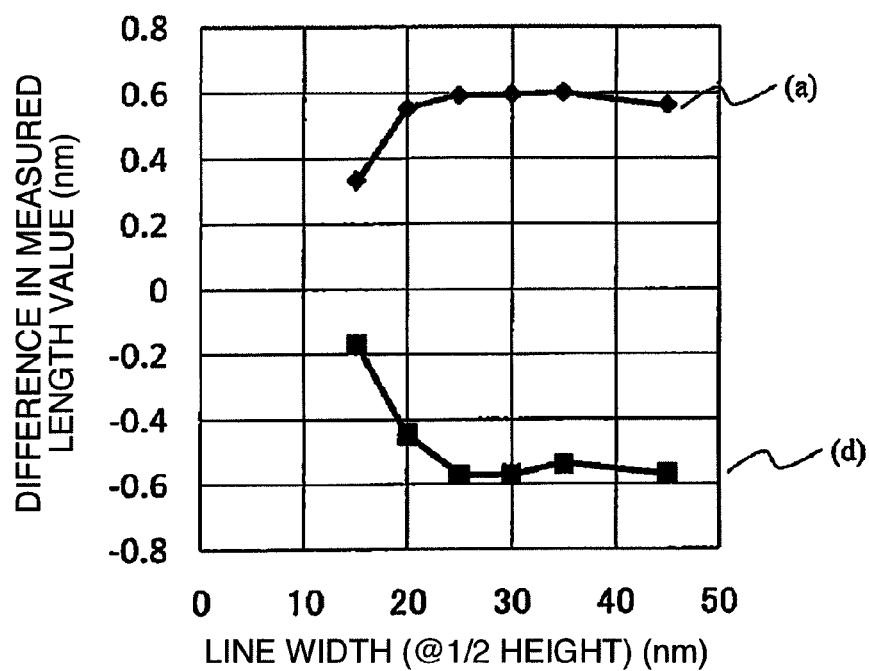

FIG. 8 is a graph for explaining differences in machine difference which depend on line pattern and space pattern.

Figure 9:
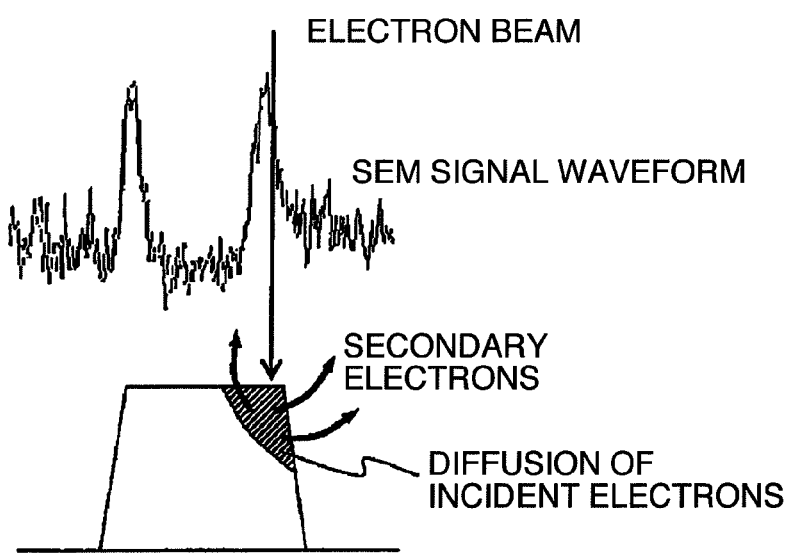

FIG. 9 is a diagram illustrative of a spread of secondary electrons.

Figure 10:
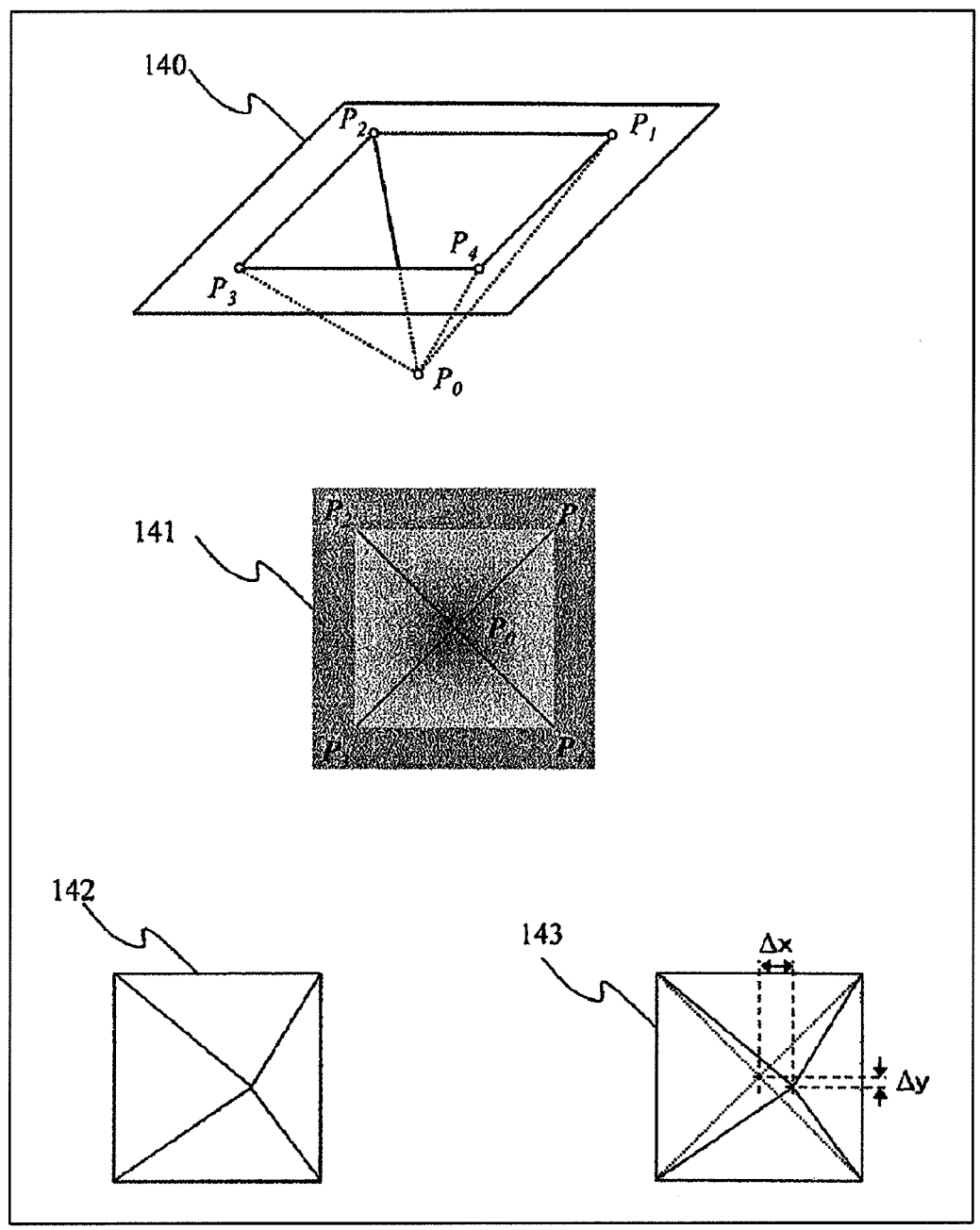

FIG. 10 is a diagram showing a method of beam tilt angle measurement using a pyramid sample.

Figure 11:
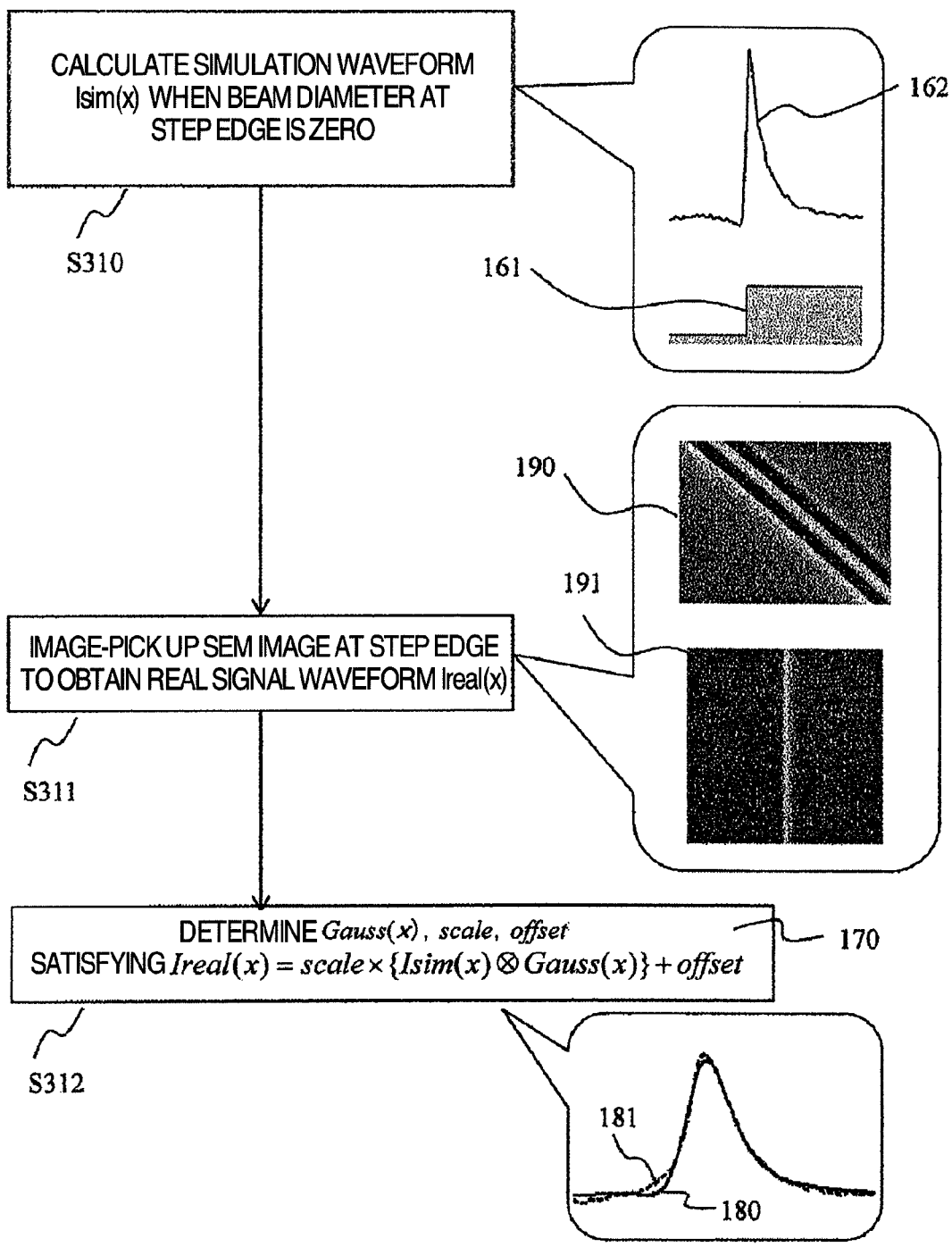

FIG. 11 is a diagram showing a first method for measuring a conversion coefficient between beam diameter and brightness.

Figure 12:
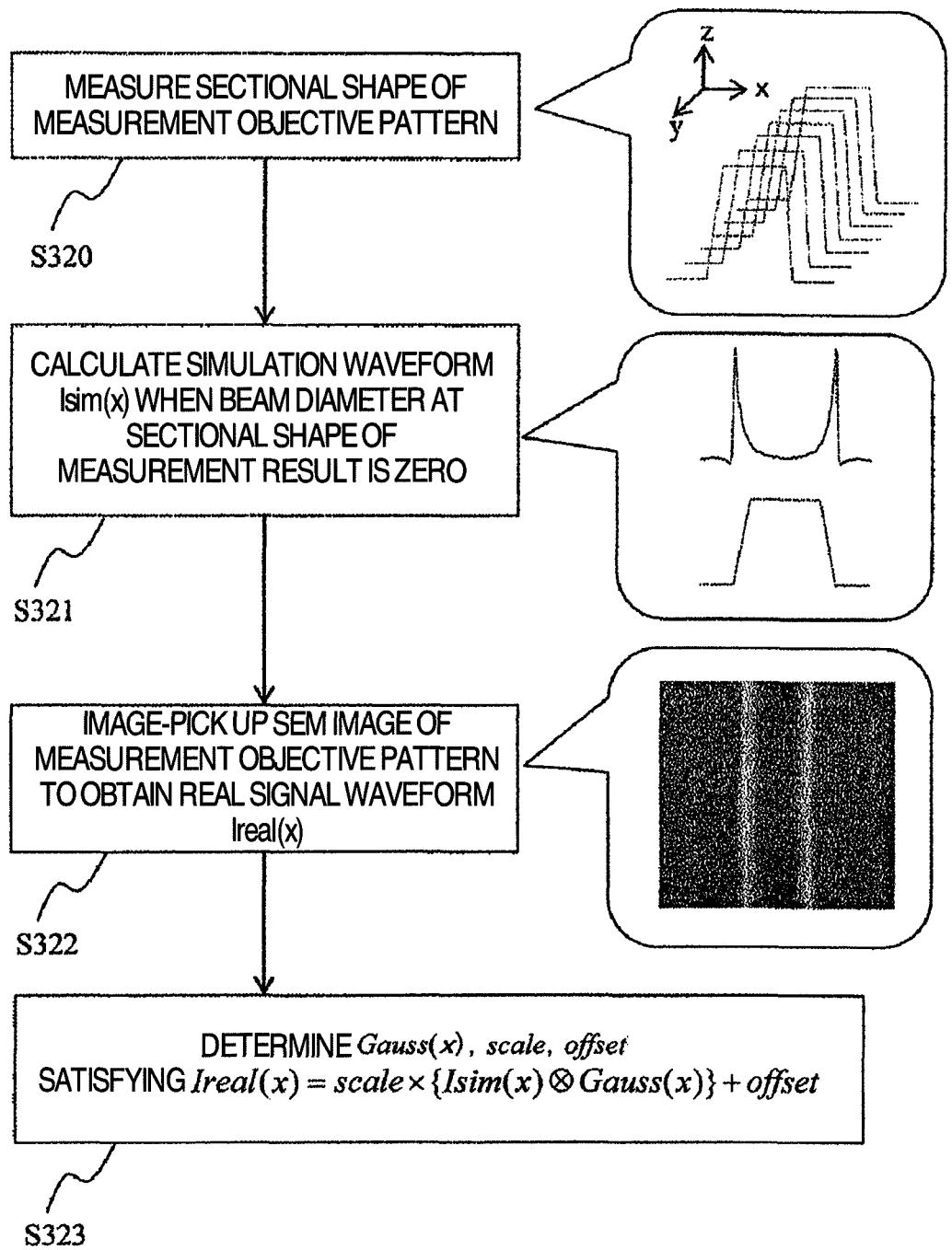

FIG. 12 is a diagram showing a second method for measuring a conversion coefficient between beam diameter and brightness.

Figure 13:
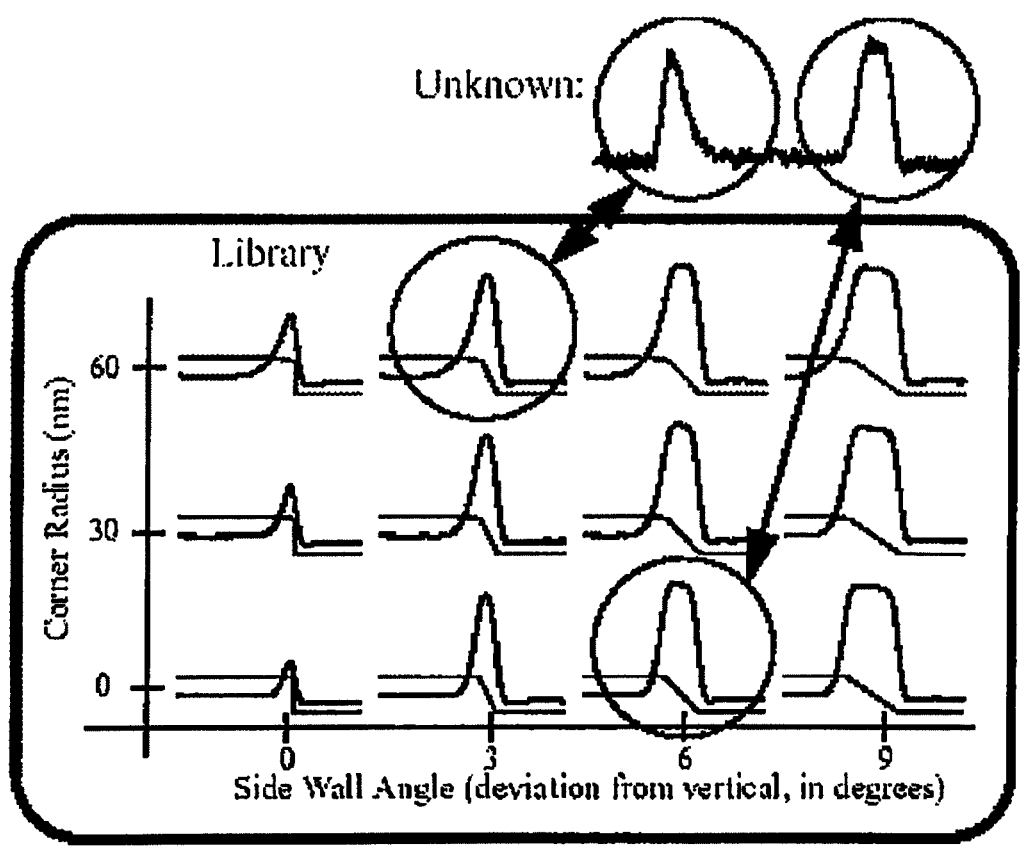

FIG. 13 is a diagram showing the principle of a model base measurement method.

Figure 14:
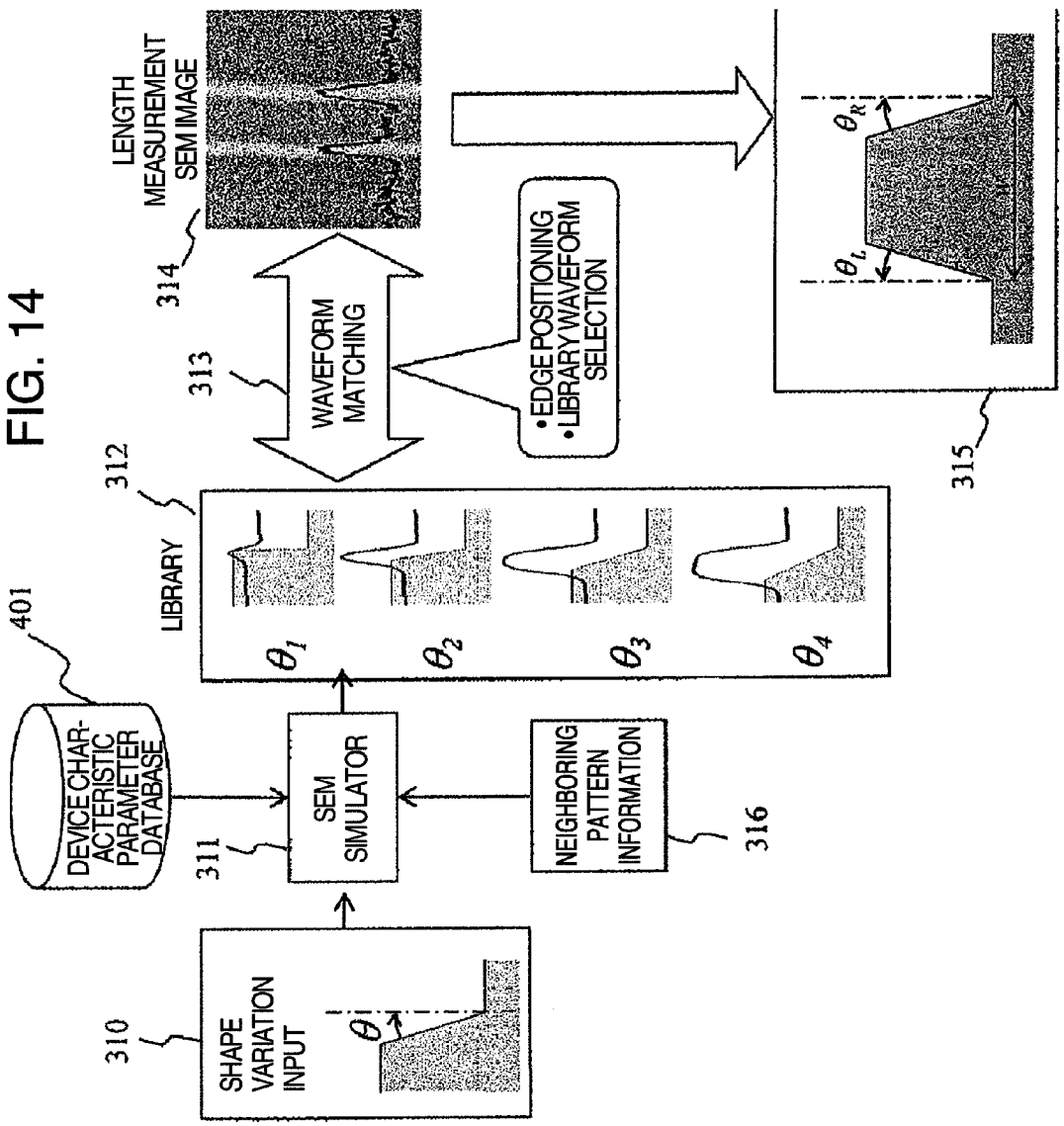

FIG. 14 is a diagram showing a method of presuming a sectional shape pursuant to the model base measurement method.

Figure 15:
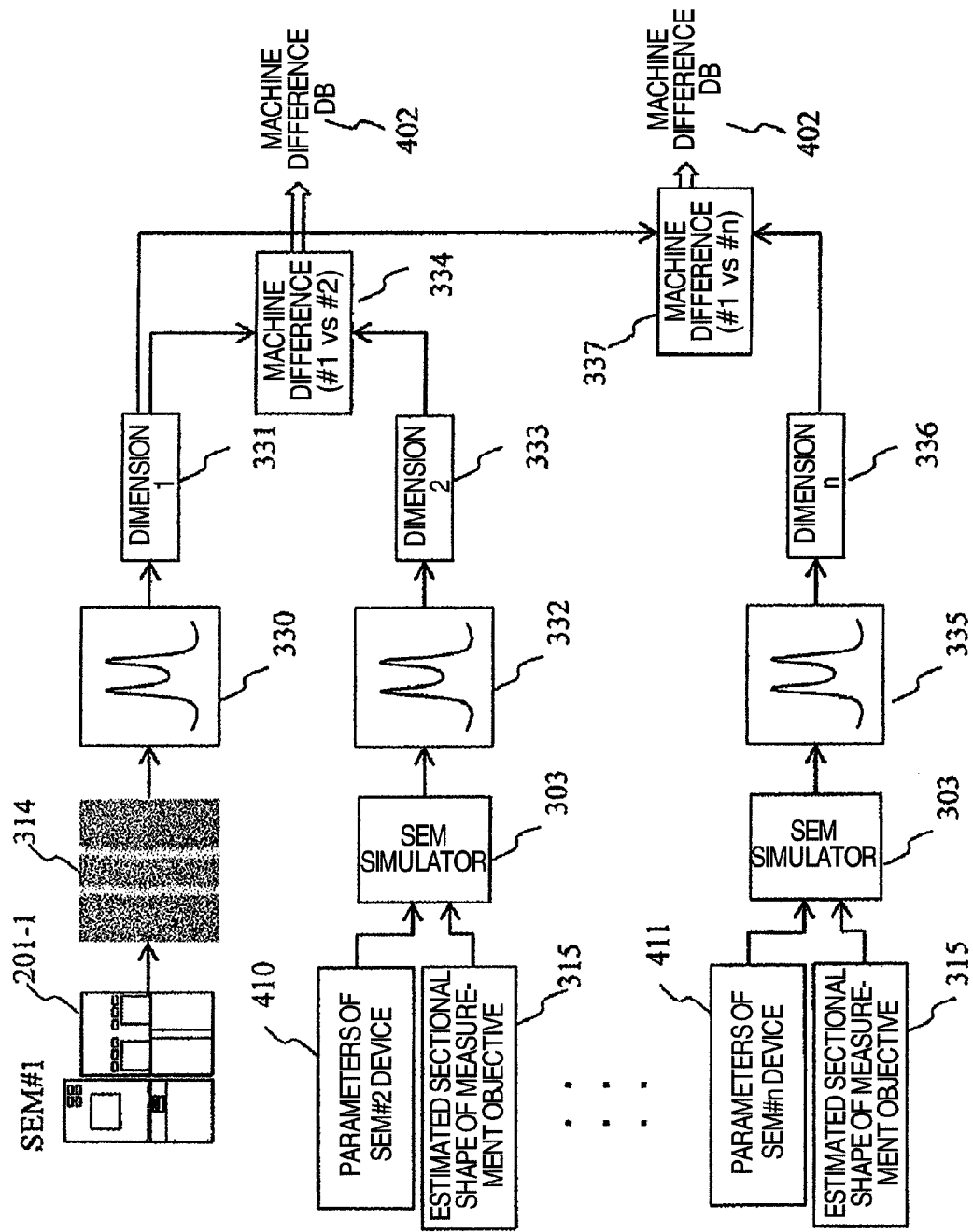

FIG. 15 is a diagram showing a flow of a process of predicting machine differences.

Figure 16:
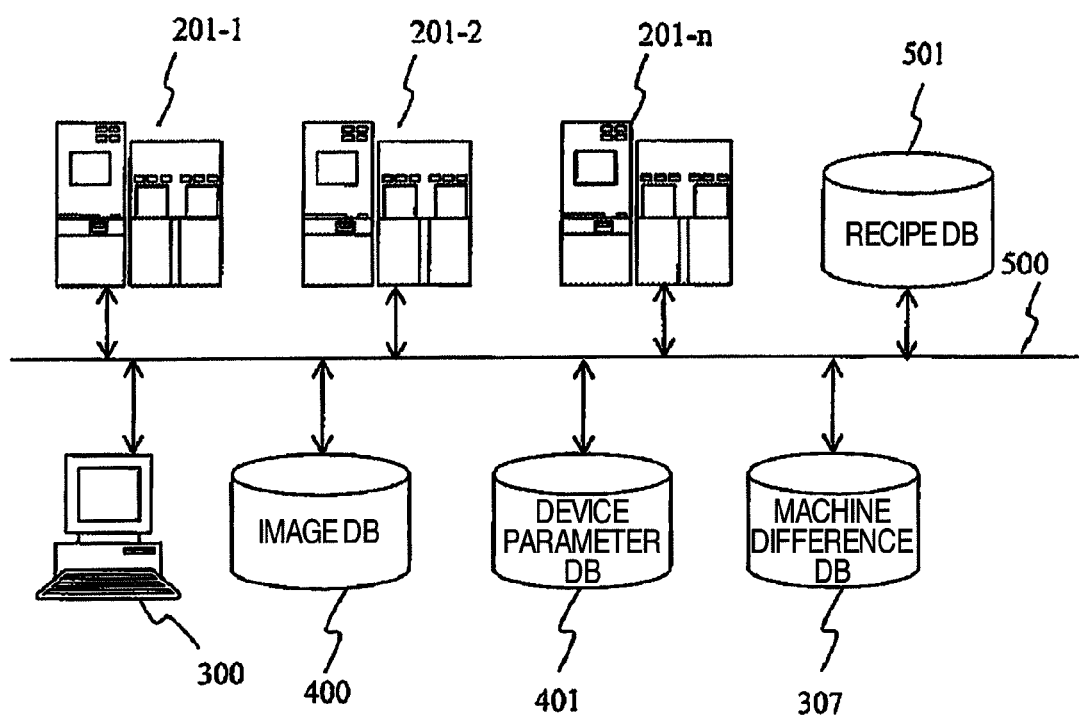

FIG. 16 is a diagram showing a system configuration.

FIG. 17 is a diagram illustrative of a GUI during preparation of a recipe.

Figure 18:
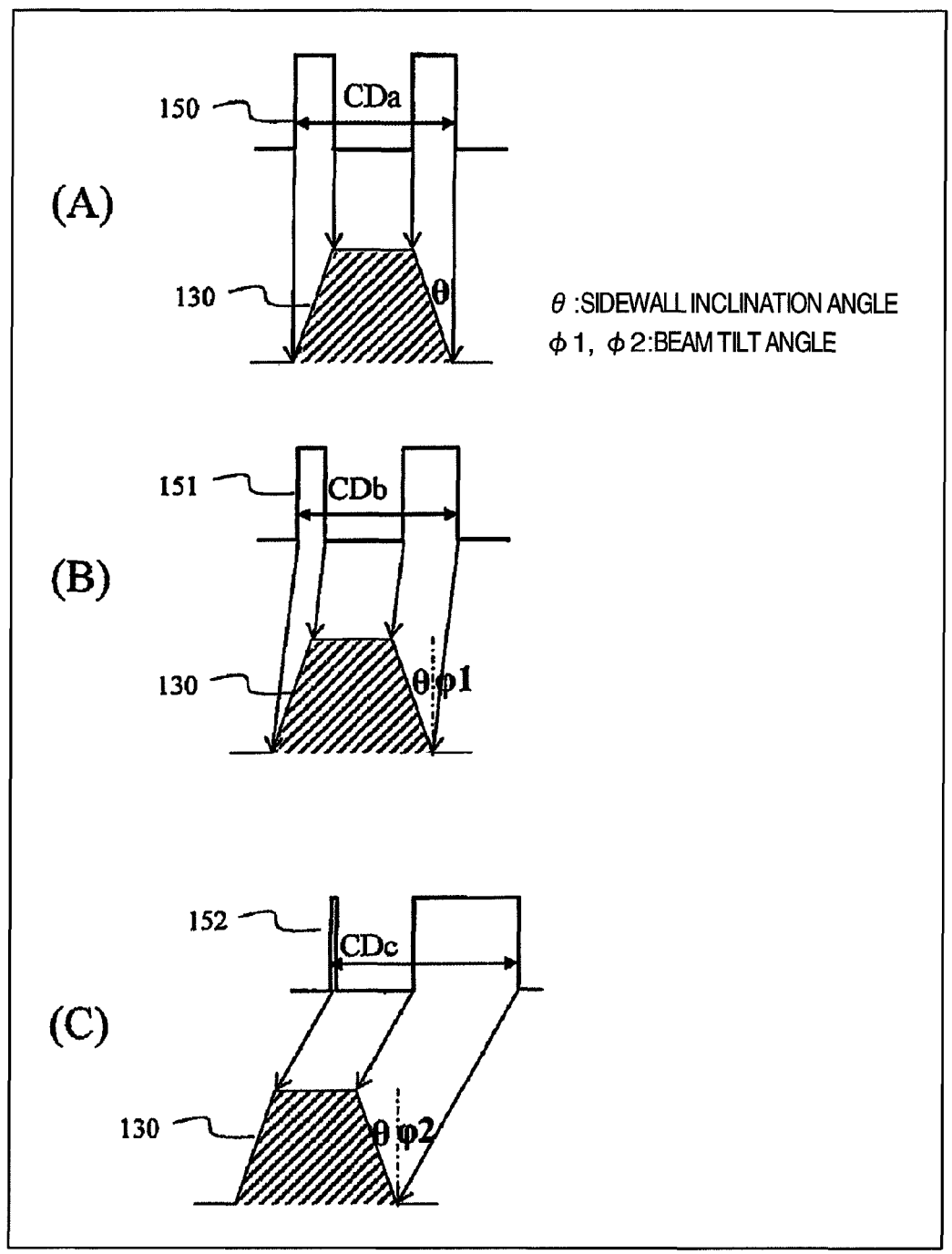

FIG. 18 is a diagram for explaining the relation between a difference in beam tilt angle and the machine difference.

Figure 19:
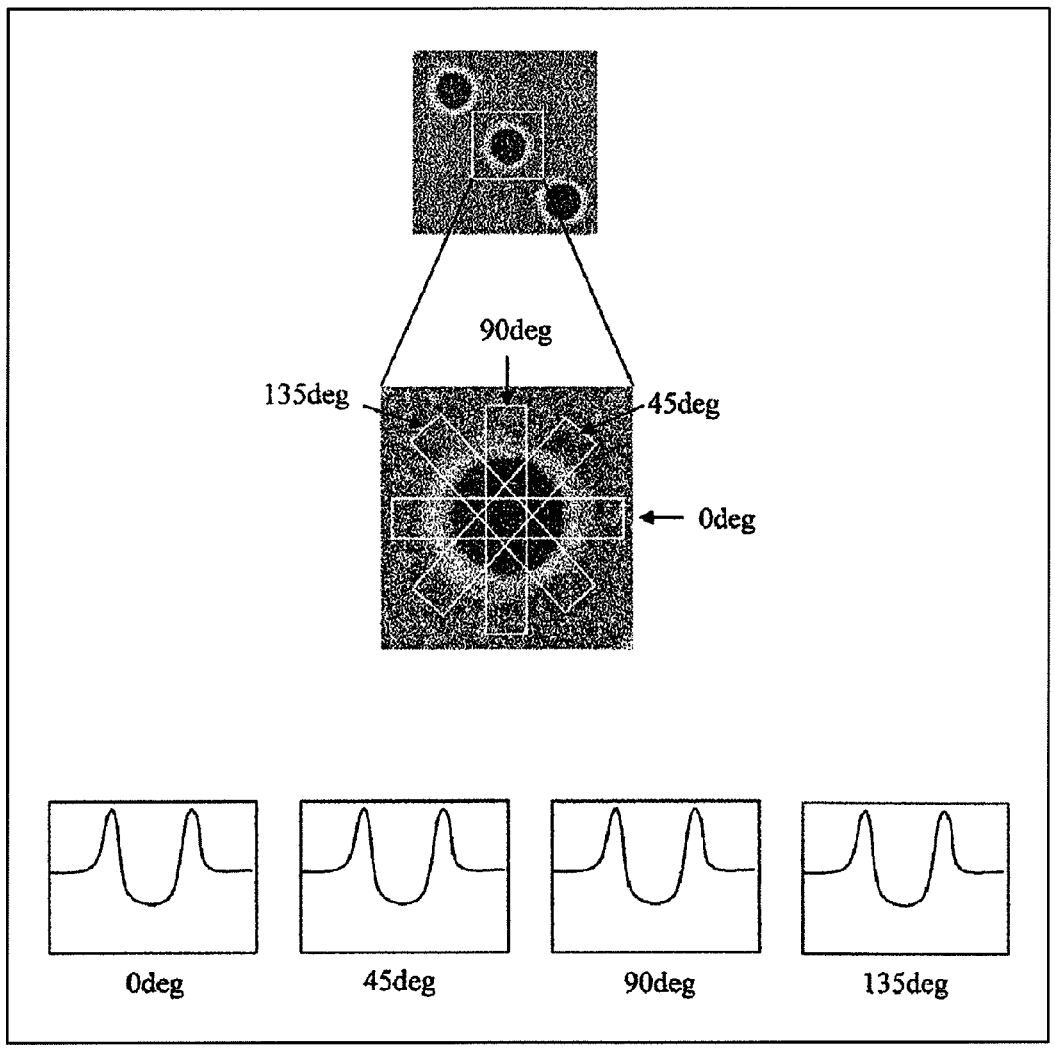

FIG. 19 is a diagram for explaining the applicability also to measurement of a hole.

Figure 20:
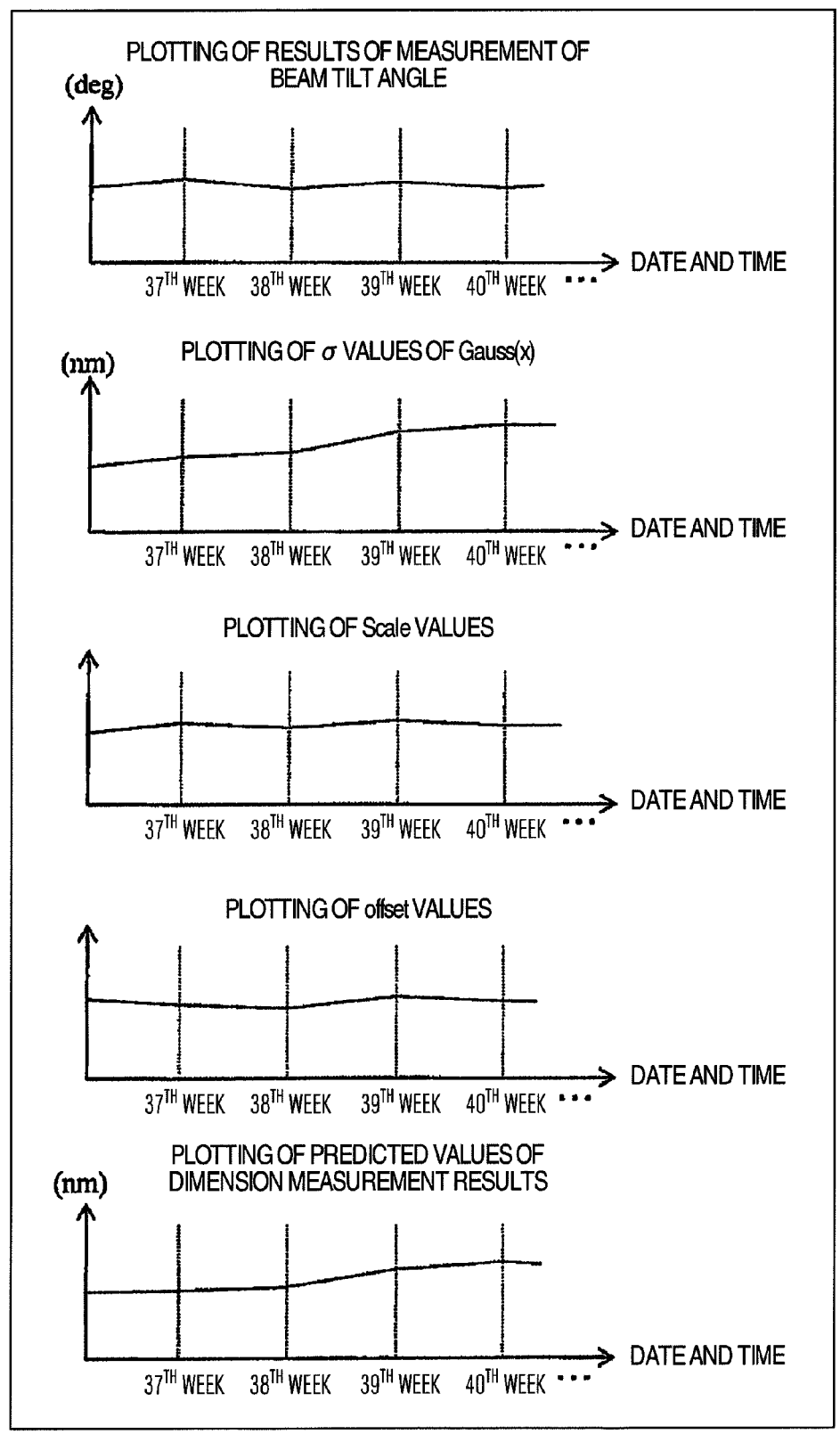

FIG. 20 is a graphic representation for explaining the application to monitoring secular change in the device.

DESCRIPTION OF EMBODIMENTS

[First Embodiment: Machine Difference Correction]

Figure 1:
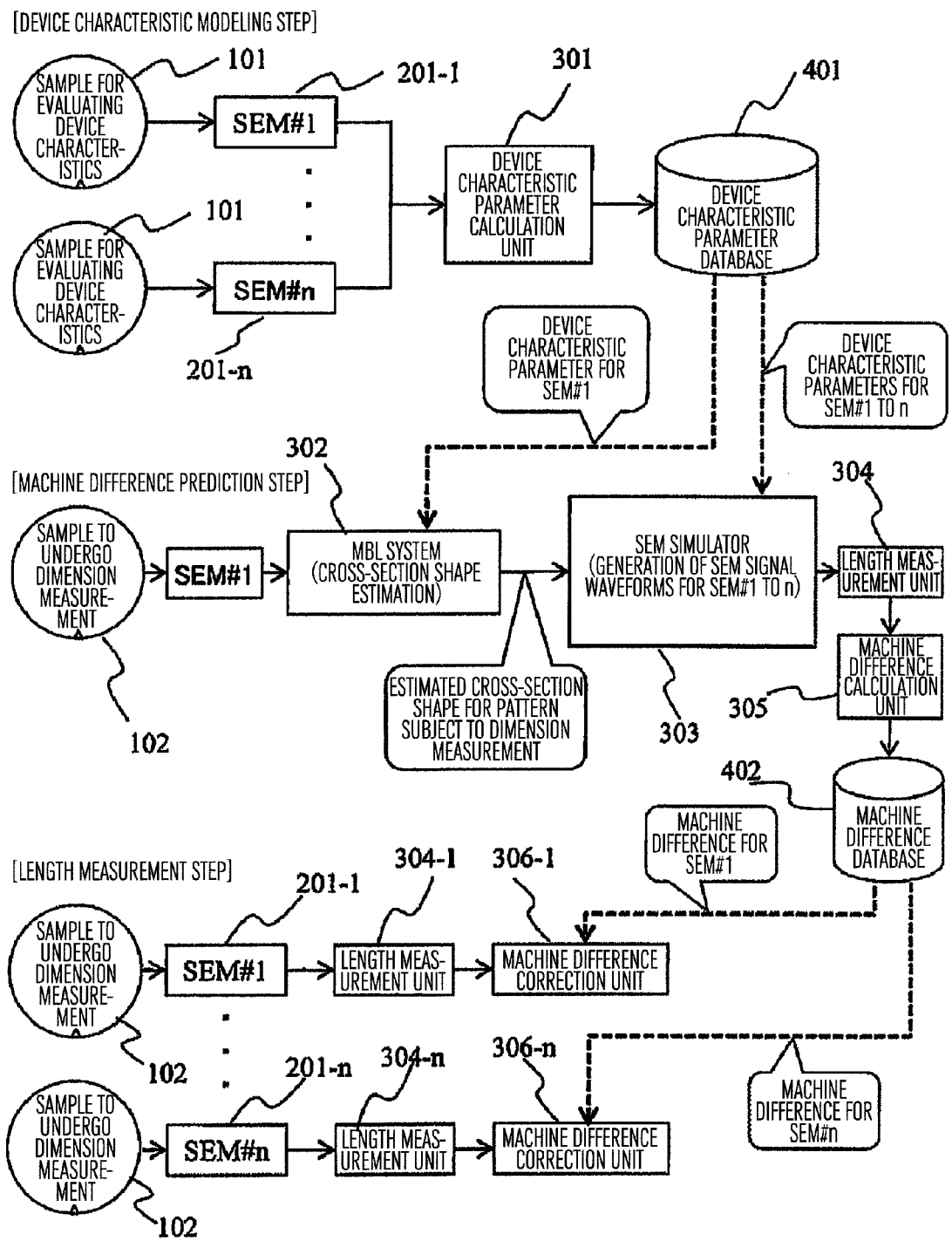
FIG. 1 is a diagram showing an overall process flow.
Figure 2:
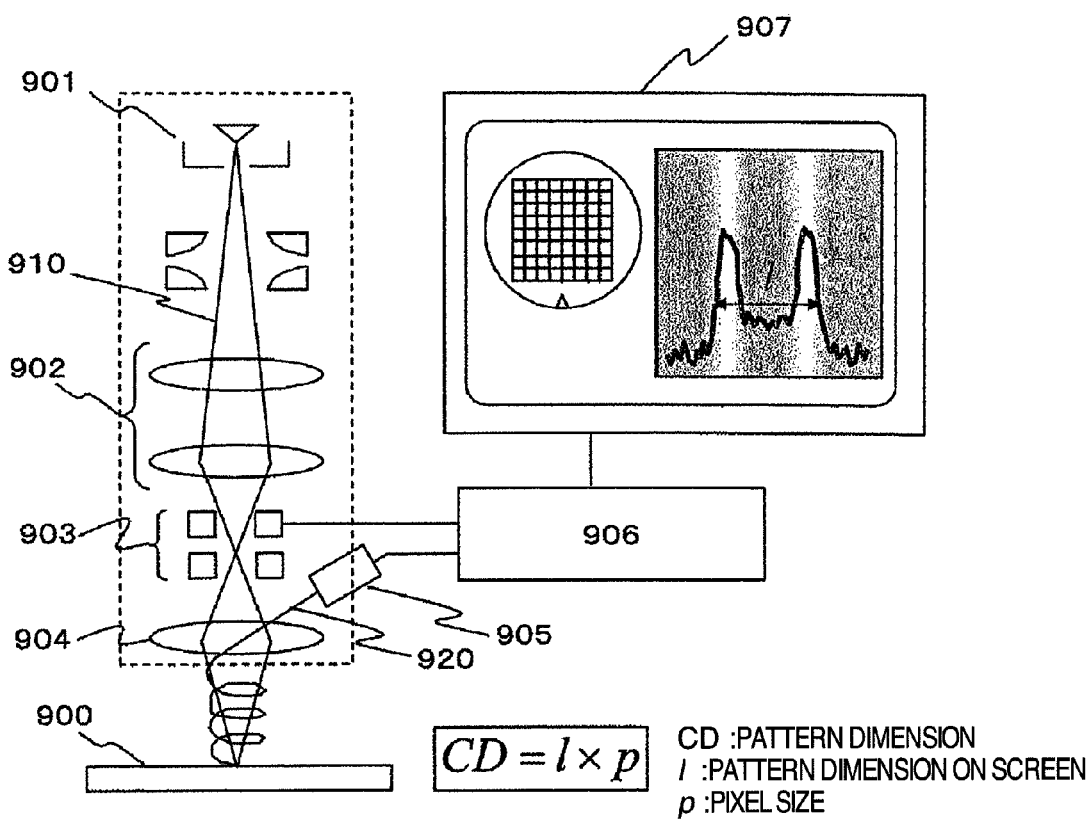
FIG. 2 is a diagram illustrating the construction of a critical dimension SEM.

Referring first to FIG. 1, an overall flow of a pattern dimension measurement corresponding to machine differences according to the present embodiment will be described.

In the present embodiment, three steps of modeling device characteristics, predicting a machine difference and measuring lengths are provided as necessarily. The respective steps will be described hereinafter.

[Step of Modeling Device Characteristics]

In the present step, with the use of samples for evaluating device characteristics 101, device characteristic parameters of critical dimension SEM's 201-1 to 201-$n$ are calculated by using a device characteristic parameter calculation unit 301 and the results are stored in a device characteristic parameter database 401.

Since the present embodiment aims at correcting machine differences, device characteristics having a large impact upon the machine differences are desired to be modeled. In the present embodiment, the desirable device characteristics will handle differences among devices in a tilt angle of an irradiation beam, a beam diameter of the irradiation beam, an efficiency of detection of secondary electrons given off from the sample.

Of them, the difference in beam diameter of the irradiation beam will cause a machine difference which in turn also changes depending on a sectional shape, a pattern density and a dimension as has been described in connection with FIGS. 6 to 8.

Figure 3:
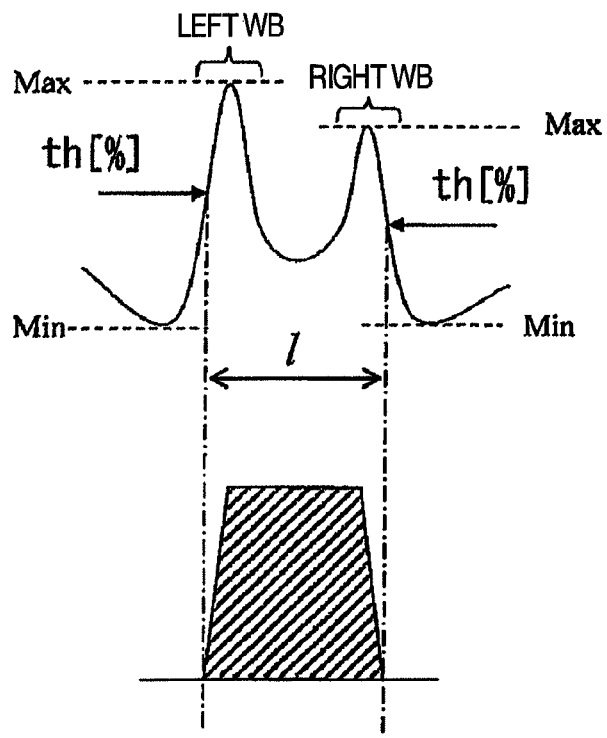
FIG. 3 is a diagram for explaining an edge point detection method in the critical dimension SEM.
Figure 4:
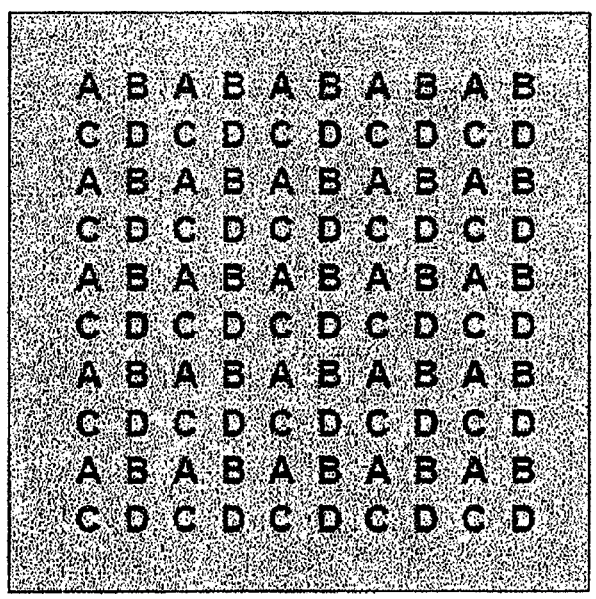
FIG. 4 is a diagram for explaining a grating method representing one of machine difference measurement methods.
Figure 5A:
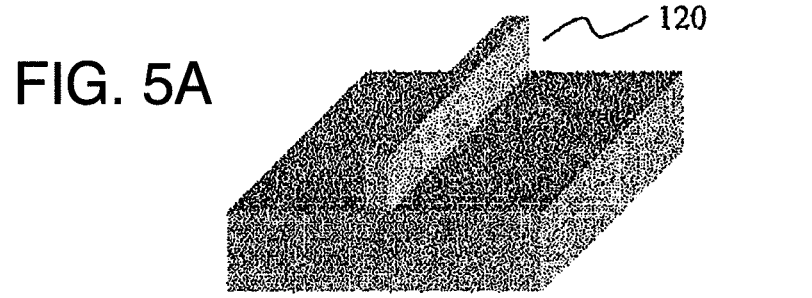
Figure 5B:
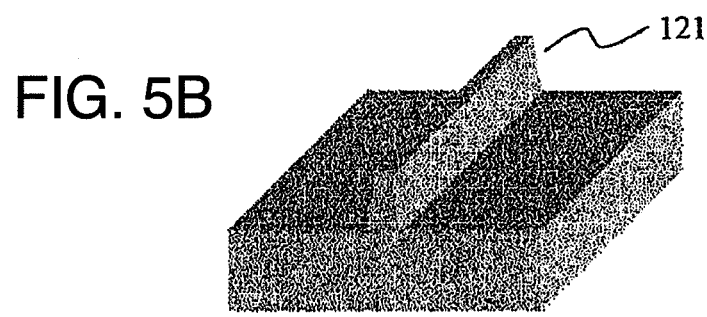
Figure 5C:
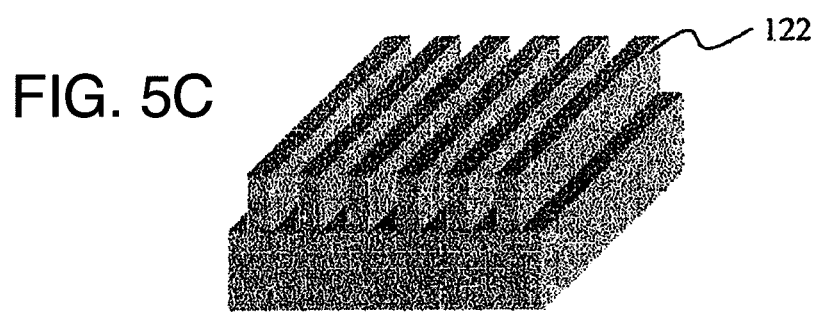
Figure 5D:
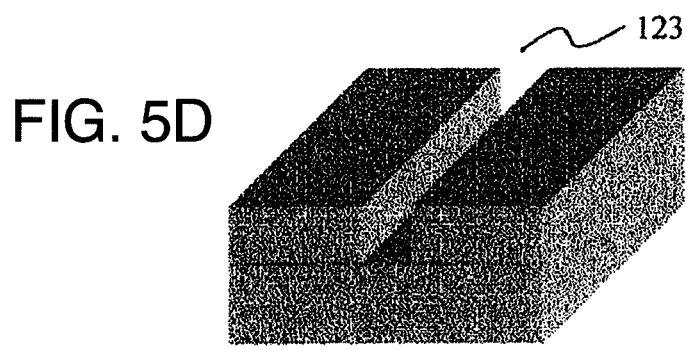

Next, the relation between the tilt angle of irradiation beam and the machine deference will be described by making reference to FIG. 18. Diagrammatically illustrated at (A) in FIG. 18 is a signal waveform 150 (as illustrated in FIG. 10, intensities of secondary electrons are larger at edge portions) when a beam is irradiated from above and vertically to a sample 130 having a trapezoidal sectional shape which has a side wall inclination angle θ. When applying a threshold value shown in FIG. 3 to this signal waveform, a dimension measurement value of CDa is determined. Illustrated at (B) in FIG. 18, on the other hand, is a signal waveform 151 when the beam tilt angle is φ1. When applying the threshold value method shown in FIG. 3 also to this signal waveform, a dimension measurement value of CDa is determined. Further, illustrated at (C) in FIG. 18 is a signal waveform 152 when the beam tilt angle is far larger, amounting up to φ2. In this case, a dimension measurement value is determined as CDc. As is clear from the figure, such a relation that CDa=CDb, and CDa<CDc stands. The relation indicates that even when the beam irradiation angle is tilted, the dimension measurement value does not change if the tilt angle is smaller than the sidewall inclination angle but if the tilt angle exceeds the sidewall inclination angle, the dimension measurement value changes. This signifies that when the beam irradiation angle differs among the devices, there occurs either a case of generating a machine difference or a case of not generating a machine difference depending on the relation between the degree of a difference in irradiation angle and the sectional shape of the measurement objective. As described above, the difference in beam tilt angle among devices can be responsible for the machine difference and, like the difference in irradiation beam diameter among devices, that machine difference changes depending on the sectional shape, pattern density and dimension of the measurement objective (FIG. 18 is a diagrammatic representation and so dependency on the pattern density and dimension is not revealed but actually, since the signal waveform changes with the pattern density and the dimension, the impact the change of tilt angle imposes changes in accordance with them obviously).

Referring now to FIG. 10, measurement of the tilt angle of irradiation beam will be described. For the measurement of the tilt angle of irradiation beam, a method described in JP-A-2005-183369, for example, is preferable. This method uses a sample in which a concave or convex pyramid shape (quadrangular prism) fabricated by the technique of crystal anisotropic etching is arranged. An example of a concave pyramid shape is designated at 140 in FIG. 10. The crystal anisotropic etching technique is a technique of fabricating a triangular mountain or a stepped structure referenced to crystal faces by utilizing such a phenomenon that when a specified etching solution is acted on a single crystal, the etching speed changes crystal face by crystal face. An angle the side surfaces corresponding to crystal faces (4 side surfaces in FIG. 10) make mutually is predetermined. To advantage, the accuracy of shape is higher than patterning based on the ordinary semiconductor process. An SEM image of the pyramid shape is designated at 141. The secondary electron intensity at the inclined portion is larger than that at a flat portion and consequently, a picture on the SEM image is brighter at side wall portion than at flat portion of the pyramid. Indicated by 141 is the case where the beam irradiation angle is not tilted but in the case of tilting, a condition indicated by 142, for example, takes place. As indicated by 143, the crest lines and the edge lines of pyramid bottom plane are detected through image processing so that a displacement $\Delta x$ in x direction and a displacement $\Delta y$ in y direction at a crossing point of the pyramid crest lines may be determined. The $\Delta x$ reflects a change $\Phi x$ in beam tilt angle in x direction and the $\Delta y$ reflects a change $\Phi y$ in beam tilt angle in y direction. Since the angle the pyramid side surfaces make mutually is known as described previously, the beam tilt angles $\Phi x$ and $\Phi y$ can be calculated from $\Delta x$ and $\Delta y$, respectively.

Reverting to FIG. 1, the aforementioned pyramid sample, for example, is used as a sample for evaluating device characteristics, images of the pyramid sample are acquired by means of the individual critical dimension SEM's 201-1~201-n, beam tilt angles in the individual critical dimension SEM's are calculated by means of the device characteristic parameter calculation unit 301 and the results are stored in the device characteristic parameter database 401.

An advantage of using the pyramid sample resides in that the angle the four side surfaces make mutually is known and the beam tilt angle can therefore be calculated by applying a predetermined calculation expression and another advantage can reside in that this method is hardly affected by other machine difference factors. A difference in beam diameter of the irradiation beam between the critical dimension SEM's develops in the form of a difference in sharpness of the edge portion in the image but the aforementioned method calculates the tilt angle on the basis of a geometrical deformation of the pyramid shape and is hardly affected by a difference in sharpness of the edge portion. In addition, on the image, the difference in efficiency of detection of secondary electrons between the critical dimension SEM's develops in the form of difference in brightness and S/N but this difference hardly affects the result of measurement of tilt angle, either.

Next, a method of measuring the efficiency of detection of the beam diameter of irradiation beam and secondary electrons will be described by making reference to FIG. 11. Here, modeling is adopted in which as indicated by a mathematical expression 170 in FIG. 11, a signal waveform Isim (x) in the case of the beam diameter being zero is convoluted by Gauss (x) corresponding to a beam intensity distribution, the resultant term is multiplied by a coefficient "scale" for adjusting the dynamic range and added by a coefficient "offset" for adjusting the offset, thereby defining a real signal waveform Ireal (x). Accordingly, device characteristic parameters to be determined are Gauss (x), scale and offset. For the Gauss (x), a $\sigma$ value of a Gaussian function is a parameter to be determined.

Available as a sample for evaluation of device characteristics desirable for calculation of these parameters is a step edge sample of known sectional shape, for example, an NCD line width standard manufactured by VLSI standard corporations in the USA. In FIG. 11, 161 designates a step edge, 162 designates a signal waveform at the step edge and besides, examples of an SEM picture at the step edge are designated by 190 and 191, respectively. In the sample, a small piece of a lamination layer film made of silicon oxide film, silicon and silicon oxide film is mounted on a wafer vertically thereto and a silicon oxide film portion is etched to leave behind a silicon portion in the form of a line pattern, thus having, in the principle of preparation, a vertical edge (sidewall inclination angle 0°) which is desired for calculation of parameters as above.

Steps (S310 to S312) shown in FIG. 11 will now be described sequentially.

Firstly, a signal waveform Isim (x) at the step edge when the beam diameter is zero is calculated through SEM simulation (step S310). In this phase, the result of measurement of a tilt angle of irradiation beam measured through the method shown in FIG. 11 is reflected. In other words, in the SEM simulation, a bombarding angle of electrons upon the sample is made coincident with the measurement result of tilt angle.

Next, a critical dimension SEM image 151 at the step edge is image-picked up to obtain a real signal waveform I real (x) (step S311). Further, by using the thus obtained Isim (x) and I real (x), the Gauss (x), Scale and Offset which satisfy mathematical expression 170 are determined (step S312). In this phase, they cannot be determined analytically and therefore, a method is adopted in which the Gauss (x), Scale and Offset are changed sequentially and at intervals of a sequential change, a degree of distance between right-hand side and left-hand side (for example, a square sum of the distance) is determined and operation is repeated until the degree of distance falls below a predetermined value. For example, a non-linear optimization method such as a LM method (Leben Markart method) can be applicable. An example of the results in the step S312 is shown in a spouting balloon. A waveform 180 corresponds to the left-hand side in mathematical expression 170 and a waveform 181 corresponds to the right-hand side when the determined Gauss (x), scale and offset are substituted for.

Reverting to FIG. 1, when using the aforementioned NCD line width standard sample as a device characteristics evaluation sample, its image is captured by means of each of the critical dimension SEM's 201-1 to 201-n, the Gauss (x), Scale and Offset are calculated in respect of each of the critical dimension SEM's by means of the device characteristic parameter calculation unit 301 and results of the calculation are stored in the device characteristic parameter database 401.

When the NCD line width standard sample is used, the sample is guaranteed to have a vertical edge (sidewall inclination angle 0°) and therefore, the use has two advantages that the actual measurement of a sectional shape is unneeded and the almost vertical edge shape has a larger sensitivity to a change in beam diameter (here, a change in σ value of Gaussian function) than a tapered edge shape.

But, when the step of actually measuring a pattern is added, the Gauss (x), Scale and Offset can be determined without using the sample called NCD line width standard sample resulting from the special fabrication method. Steps of parameter calculation in this case are illustrated in FIG. 12. In FIG. 12, in the initial step S320, a sectional shape of a sample is measured. In a spouting balloon associated with S320, results of measurement of a line pattern extending in y direction by means of an interatomic force microscope are shown diagrammatically. Measurement results can be obtained by a number corresponding to the number of operations of scanning with the help of the interatomic force microscope and by averaging the measurement results, a mean sectional shape can be determined. In the next step S321, by inputting the sectional shape obtained in the preceding S320, SEM simulation is carried out to calculate a simulation waveform Isim (x) when the beam diameter in the determined sectional shape is zero. Then, like the steps S311 and S312 shown in FIG. 11, steps S322 and S323 are conducted to obtain Gauss (x), Scale and Offset.

[Step of Predicting Machine Difference]

Next, by making reference to FIG. 1, a machine difference prediction step will be described. In the present step, a sample 102 representing a dimension measurement objective is image-picked up by mean of the SEM#1 device, a sectional shape of measurement objective pattern is presumed by means of a MBL system 302 (to be detailed later) and then, in the SEM simulator 303, by using the presumed sectional shape and device parameters of individual critical dimension SEM's (#1 device to #n device) stored in advance in the device characteristic parameter database 401, signal waveforms of the individual critical dimension SEM's are generated. Thereafter, in a length measurement unit 304, measurement of dimension of signal waveform of each SEM is conducted, differences in dimension among the critical dimension SEM's are determined by the machine difference calculation unit 305 and the results are stored in the machine difference database 402.

Turning now to FIGS. 13 and 14, the contents of processing in the MBL system will be described. The MBL method (Model/base/library Matching Method) is a method of estimating a sectional shape of an objective by calculating in advance SEM waveforms in various sectional shapes through SEM simulation as shown in FIG. 13 and by matching the SEM waveform with a real waveform. It is to be noted that FIG. 13 is an extraction from a literature [J. S. Villarrubia, A. E. Vladar, J. R. Lowney, and M. T. Postek, "Scanning electron microscope analog of scatterometry," Proc. of the SPIE, Vol. 4689, pp. 304-312 (2002)].

Shape variations only are inputted to an SEM simulator in FIG. 13 whereas according to the present invention, in addition to the shape variation 310, device characteristic parameters 401 and neighboring pattern information 316 are inputted as shown in FIG. 14. As described previously, the tilt angle and the Gauss (x), scale and offset of the irradiation beam are stored in the device characteristic parameter database. Here, the device parameters of SEM#1 device are taken out of the database and these values are substituted for when generating signal waveforms in the SEM simulation. As the SEM simulator 311, the same one as used in the step S310 in FIG. 11 or the step S321 in FIG. 12 may be used. Inputting the neighboring pattern information (for example, the pattern pitch or the like) is executed because as described previously, the pattern density also has an influence upon the SEM signal waveform. Accordingly, a library 312 will be adopted which takes the real device condition and the influence of neighboring patterns into account. By matching (313) the library waveforms with a real signal waveform obtained from an SEM image 314 of a dimension measurement objective, by selecting a library waveform and by determining an edge position, a sectional shape 315 of the dimension measurement objective can be presumed.

It is to be noted that, for simplification of explanation, a parameter of only the side wall inclination angle θ is employed as the shape variation in FIG. 14 but for more correct measurement, parameters suitable to express a shape of a measurement objective (for example, roundness of top or bottom or in the case that the sidewall inclination angle differs at upper and lower portions, the upper sidewall inclination angle and the lower sidewall inclination angle) may be inputted as necessary. Further, as the neighboring pattern information, design data of the dimension measurement objective sample or the like may be used properly.

As compared to the conventional MBL method (FIG. 13), the stability of sectional shape presumption increases by substituting device parameters settled in advance and besides, the influence of neighboring patterns is also taken into account, thus leading to such an advantage that a correct sectional shape can be presumed. The above is the contents of processing in the MBL system 302 in FIG. 1.

Next, with reference to FIG. 15, the contents of processing in the length measurement unit 304 and machine difference calculation unit 305 in FIG. 1 will be described. In the length measurement SEM #1 device (201-1), an SEM image 314 of the dimension measurement objective pattern has already been image-picked up (already been acquired for the use in the step 302 in FIG. 1, namely, in order to be used in the step of estimating a sectional shape in the MBL system) and so, by applying a predetermined edge detection method such as the threshold value method (see FIG. 3) to a real signal waveform 330 of the SEM image 314, a dimension 331 is calculated. In the critical dimension SEM #2 device, device parameters 410 of #2 device are taken out of a device parameter database, not shown, these parameters and the previously presumed sectional shape 315 of measurement objective pattern are inputted to the SEM simulator 303 to generate a artificial signal waveform 332 to which the threshold value method is also applied so as to calculate a dimension 333. Then, a difference between the dimensions 331 and 333 is determined (334) and the result is stored in the machine difference database 402. Other critical dimension SEM's (#3 device~#n device) may be treated similarly. In this manner, the predictive machine difference of the dimension measurement objective pattern is stored in the machine difference database 402. In connection with FIG. 15, an example is described in which the machine difference between the critical dimension SEM #1 device and another critical dimension SEM is determined but this is not limitative and machine differences among the individual devices may all be acquired and stored.

Generally, in ordinary running of the critical dimension SEM, data describing an image-pick up sequence (a series of operations such as wafer alignment, pattern position recognition and auto-focusing) and a length measurement method (the type of length measurement such as line or hole, edge detection method and various conditions therefor) called a recipe is prepared in advance and in the actual measurement, the data is called out to conduct dimension measurement automatically. Preferably, the process for predicting the machine difference and storing the results in the machine difference database may be carried out in parallel with the recipe preparation. FIG. 17 illustrates an example of GUI to be displayed on the screen of computer 30 for the sake of preparing a recipe. In addition to such items of length measurement condition as length measurement type 601, length measurement scheme 602, waveform smoothing filter size 603 and length measurement box size 604, an item of machine difference correction is provided and in the case of applying the machine difference correction, a check mark 611 is turned on to input, at 612, a file name of database described with machine differences. Further, output items are designated at 610. For example, when a dimension before machine difference correction and a dimension after machine difference correction are both outputted, two of 613 and 614 are turned on. The GUI illustrated herein is a mere example and obviously, various alternations and changes may be possible within the range permitting the aforementioned function. Furthermore, though not illustrated, an SEM image of dimension measurement objective sample or the like may be outputted in addition to the aforementioned dimensions before and after machine difference correction and may be displayed either simultaneously or by switching over the screen, thus permitting various alternations.

Check items 615 to 617 are those to be turned on when measurement of a pattern dimension at a desired height is necessary. In the present invention, the sectional shape of a measurement objective pattern has been presumed in the MBL system (302 in FIG. 1) and therefore, when using differences between bottom dimension, ½ height dimension and top dimension determined from the presumed sectional shape and the dimension measurement results at 331 in FIG. 15, respectively, a dimension at a desired height can also be outputted. More specifically, where Δ bottom represents a difference between a dimension measurement result of critical dimension SEM #1 device and a bottom dimension determined from a sectional shape presumed in the MBL system, CD i represents a dimension measurement result in the critical dimension SEM #i device and d i represents a machine difference from the critical dimension SEM #1 device described in the machine difference database, a bottom dimension can be calculated from mathematical expression 4 when the bottom dimension 615 is turned on in the SEM #i device and can be outputted as one item of the result of length measurement.

$$\text{Bottom dimension} = CD\ i - d i - \Delta \text{ bottom} \quad \text{(MATH. 4)}$$

The ½ height dimension and top dimension can be dealt with in a similar manner. It will be appreciated that the item 610 is for handling the sectional shape of dimension measurement objective pattern as a trapezoid and in the case of a shape resulting from laminating two trapezoids having different upper sidewall inclination angle and lower sidewall inclination angle as described previously, the item at 610 will obviously be changed correspondingly.

[Step of Measuring Length]

Finally, a step of length measurement will be described by making reference to FIG. 1. The dimension measurement in each device is carried out in accordance with the contents of description in recipe as described previously. When the machine difference correction is selected in the critical dimension SEM #n device (in the case of 611 in FIG. 17 being on), the measurement of dimensions of a dimension measurement objective sample is conducted (304-$n$) in the critical dimension SEM #n device 201-$n$ and thereafter, a machine difference of the SEM #n device is read out of the machine difference database and with the dimension measurement result rendered corrected, a dimension of a final dimension measurement objective sample is measured. In the phase of 304-$n$, the dimension measurement result includes a machine difference but after going through a machine difference correction unit 306-$n$, a measurement value devoid of the machine difference can be obtained. Outputted are the individual items designated in GUI in FIG. 17.

[Overall System]

With reference to FIG. 16, an example of system configuration of a pattern dimension measurement system dealing with machine differences according to the present invention will be described. The present system is configured by properly using a plurality of critical dimension SEM's 201-1, 201-2, . . . 201-$n$ coupled to a local area network 500, a recipe database 501 for storing recipes of the critical dimension SEM's, a database 400 for storing SEM images image-picked up by the critical dimension SEM's, a database 401 for storing device parameters, a database 307 for storing machine differences and a computer 300.

The computer 300 performs individual processes of device parameter calculation (301), sectional shape presumption (302) based on the MBL system and SEM signal waveform generation (303) through SEM simulation as shown in FIG. 1. All of the processes use the SEM simulator in common and besides, when SEM images acquired by the critical dimension SEM are stored in the image database 400 in advance, the processes can all be executed in an off-line fashion and accordingly, it is preferable to provide the computer as a dedicated calculator as in the present configuration. It will be appreciated that the computer for performing input and output operations and the calculator for performing the individual processes as above may be provided separately from each other.

It will also be appreciated that line-shaped patterns are illustrated as measurement objective in FIG. 5 but the objective the present invention deals with is not limited to the line pattern. The machine difference correction method and the pattern dimension measurement method dealing with machine differences can also be applied in a similar manner to measurement of a pattern of holes as shown in FIG. 19 and measurement of an arbitrary shape other than the hole. In typical measurement of a hole, signal waveforms are captured in different directions (in FIG. 19, 0 degree, 45 degrees, 90 degrees and 135 degrees), for example, a dimension is determined by performing an edge detection through the threshold value method, for instance, in respect of the individual signal waveforms, and an average of dimension measurement results in all of the directions is outputted as a hole diameter. In applying the present invention to the hole measurement as above, for preparing a library in connection with FIG. 14, the input shape is set to a hole and a hole distance is inputted as neighboring pattern information to prepare the library and then, waveform matching 313 is conducted to obtain a sectional shape of the hole in a given direction. The above procedures are carried out in connection with individual directions (in the case of the measurement method in FIG. 19, four directions of 0 degree, 45 degrees, 90 degrees and 135 degrees). Subsequently, in FIG. 15, SEM simulation is conducted by inputting the sectional shapes in the respective directions to obtain signal waveforms for measurement of dimensions and an average of values in the all directions can be determined as a hole diameter. In the case of another arbitrary shape, too, the dimension can be measured by performing a similar process while dividing an objective pattern properly.

[Second Embodiment: Monitoring Secular Changes in Device]

In the first embodiment, the machine difference correction method applied to a plurality of objectives of critical dimension SEM's and the pattern dimension measurement method corresponding to machine differences have been described but the present invention can also be applicable to monitoring secular changes in the respective types of devices. Since details of processing conducted in the second embodiment are similar to those in the processing described in connection with the first embodiment, different points will principally be described hereinafter.

In order to monitor secular changes in the device, calculation of device characteristic parameters (execution of the step 301 in FIG. 1) is conducted periodically, device parameters are inputted at intervals of a time and SEM signal waveforms are generated (execution of the steps 303 and 304 in FIG. 1). In this phase, the device characteristic parameters periodically calculated are stored in a database by linking them to dates and times of calculations. Where, as shown in FIG. 20, abscissa represents date and time and ordinates represents parameters and dimension measurement results of each device, the degree of secular changes in the device can be confirmed and a hint on causes of secular changes in the device can be obtained. For example, when the beam tilt angle varies, misalignment of the optical axis is questionable, when the beam diameter changes, degradation of the electron gun is questionable and when the scale value changes, a change of irradiation beam current is questionable. To add, the calculation of the device characteristic parameters is not always conducted periodically but non-periodical execution may suffice.

Only monitoring secular changes in the device characteristic parameters is meaningful but according to the above method, an impact on the dimension measurement result can be known. In other words, it is possible to decide that urgent countermeasures are necessary when a change develops in dimension measurement results and that urgent countermeasures are unnecessary when the dimension measurement result does not change.

Further, the present embodiment is advantageous from the view point of accuracy over the conventional secular change monitoring method. Conventionally, for dealing with the device secular change, such a method as the grating method set forth in background art has been utilized (since the time cannot be retraceable, the ABBA method cannot be applied). More specifically, many spots on a sample are measured, an average of the measurement results is determined and by comparing the result of average with the result in the past, secular changes in the device can be monitored. The grating method has, however, a problem that the accuracy cannot be obtained unless a great number of measurement points are used. In addition, when the result of dimension measurement is changed by a change in dimension caused by the generation of an oxide film on the surface which depends, in the degree, on the material and preservation state of the sample, there arises a critical problem as to whether that change is due to secular change of the device or secular change in the sample. In the case of the present invention, on the other hand, the probability of occurrence of secular change in the device characteristic evaluation sample 101 used in the step of modeling the device characteristics in FIG. 1 cannot be denied perfectly but the surface oxide film is considered as scarcely having an influence upon the pyramid sample shown in FIG. 10, upon the step edge sample shown in FIG. 11 and upon the device characteristic parameter extracted by using these samples. In the case of the pyramid sample, only an angle the four side surface make mutually is used as known information and therefore, in the absence of a change in the angle, the measurement result of beam tilt angle is not at all affected. This also stands substantially for the case of step edge sample. Only the verticality of side wall inclination angle is used as known information and therefore, unless this property changes, it has no influence upon the result of calculation of the device characteristic parameters (Gauss (x), scale and offset). It is hardly considerable that the deposition of surface oxide film will cause the angle the four side surfaces of pyramid sample make to change and the sidewall inclination angle of step edge sample as well to change. Then, in FIG. 20, the dimension measurement result to be outputted is a prediction value of dimension measurement result when the device condition changes and obviously, it does not matter whether the output dimension measurement result is due to secular change in device or secular change in sample.

While the invention made by the present inventors has been described specifically on the basis of the embodiments, the present invention is in no way limited by the embodiments set forth so far and can obviously be altered or changed in various ways without departing from the gist thereof.

For example, in the foregoing first and second embodiments, the device characteristic parameters represented by the beam tilt angle, beam diameter (Gauss (x)) and brightness conversion coefficient (scale, offset) are treated as measurement objectives but this is not limitative, implying that in the case of existence of other device characteristic parameters having influence upon the results of dimension measurement, they may be used also as measurement objectives appropriately.

Advantageous effects obtainable by typical ones of inventions disclosed in the present application will be described briefly as below.

According to the first embodiment of the present invention, the machine difference can be predicted by modeling the device characteristics in advance and on the basis of the result of prediction, the machine difference can be corrected. As compared to the conventional method in which a machine difference is measured actually and on the basis of the result of measurement, the dimension measurement value is corrected, the labor and time can be reduced to a great extent. Consequently, when critical dimension SEM's of different types coexist, mingling with a critical dimension SEM of old type, for instance, becomes possible and a large merit can be obtained from the standpoint of effective utilization of critical dimension SEM's.

In addition, according to the second embodiment of the present invention, the most critical conventional problem that the secular change in sample cannot be discriminative from the secular change in device can be solved and therefore, more accurate secular change monitoring can be possible.

REFERENCE SIGNS LIST

101 . . . Material for evaluating device characteristics
102 . . . Dimension measurement objective sample
120~123 . . . Variations of pattern shape
130 . . . Pattern sectional plane
140, 141, 142, 143 . . . Pyramid sample
150, 151, 152 . . . Signal waveform
161 . . . Step edge sample
162, 180, 181 . . . Signal waveform
170 . . . Model mathematical expression
201-1~201-$n$ . . . Critical dimension SEM's
300 . . . Computer
301, 302, 303, 304, 305, 306 . . . Respective processing units 310 . . . Shape variation input unit
311 . . . SEM simulator
312 . . . Simulation waveform library
313 . . . Waveform matching process unit
315 . . . Presumed sectional shape
316 . . . Neighboring pattern information
314 . . . SEM image
330 . . . Real signal waveform
332, 335 . . . Artificial signal waveform
334, 337 . . . Machine difference calculation unit
401, 402, 307, 501 . . . Database
410, 411 . . . Device parameter
500 . . . LAN
601~617 . . . Parts of GUI
S310~S312 . . . Step of calculating beam diameter and brightness conversion coefficient
S320~S323 . . . Step of calculating beam diameter and brightness conversion coefficient

The invention claimed is:

1. A pattern dimension measurement method comprising the steps of:
scanning a dimension measurement objective sample by using a first electron microscope device representing one of a plurality of electron microscope devices mutually coupled through a network so as to acquire an image of a pattern of said dimension measurement objective sample;
comparing a real signal waveform of said image of said pattern of said dimension measurement objective sample with a simulation waveform library prepared through simulation by using device characteristic parameters of said first electron microscope device among device characteristic parameters of said plurality of electron microscope devices which are stored in advance so as to obtain a presumed cross-sectional shape of the pattern of said dimension measurement objective sample;
generating a plurality of simulated signal waveforms corresponding to each of the plurality of electron microscope devices exclusive of said first electron microscope by using the obtained presumed cross-sectional shape of the dimension measurement objective sample and device characteristic parameters of each of the plurality of electron microscope devices exclusive of said first electron microscope among said plurality of electron microscope devices;
calculating machine differences among each of the plurality of electron microscope devices inclusive of said first electron microscope by using a dimension of the pattern of said dimension measurement objective sample calculated on the basis of said real signal waveform and a dimension of the pattern of said dimension measurement objective sample calculated on the basis of each of the plurality of simulated signal waveforms so as to store, as machine difference information, the calculated machine differences among each of the plurality of electron microscope devices in a machine difference database; and
correcting a dimension measurement result of the pattern of said dimension measurement objective sample obtained through the use of at least one of said plurality of electron microscope devices by using the machine difference information stored in said machine difference database so as to measure a dimension of the pattern of said dimension measurement objective sample.

2. A pattern dimension measurement method according to claim 1, wherein said simulation waveform library used in the step of obtaining the presumed cross-sectional shape is prepared by using neighboring pattern information of the pattern of said dimension measurement objective sample, in addition to device characteristic parameters of said first electron microscope device among the device characteristic parameters of said plurality of electron microscope devices which are stored in advance.

3. A pattern dimension measurement method according to claim 2, wherein said device characteristic parameters of said plurality of electron microscope devices which are stored in advance include a tilt angle and a beam diameter of an irradiation beam of each of said plurality of electron microscope devices and the efficiency of detection of secondary electrons from the sample.

4. A pattern dimension measurement method according to claim 3, wherein the irradiation beam tilt angle of each of said plurality of electron microscope devices which represents one of the plurality of device characteristic parameters of said plurality of electron microscope devices which are stored in advance is obtained by image-picking up a pyramid pattern formed through anisotropic etching as a sample for evaluating device characteristics with the help of each of said plurality of electron microscope devices, by detecting each crest line of said pyramid pattern on each of the image-picked up images obtained through image-pick up and by measuring a beam tilt angle from geographic distortion of crest line of the detected pyramid pattern.

5. A pattern dimension measurement method according to claim 3, wherein as the beam diameter and detection efficiency of the irradiation beam of each of the plurality of electron microscope devices which represent the device characteristic parameters of the plurality of electron microscope devices which are stored in advance, a function expressing such a beam intensity distribution that, using a step edge sample as a device characteristic evaluation sample, a simulation waveform at a zero beam diameter obtained through SEM simulation coincides with a real waveform obtained from an SEM image of said step edge sample and a brightness conversion coefficient are used.

6. A pattern dimension measurement method according to claim 1, wherein when obtaining the presumed cross-sectional shape of the pattern of said dimension measurement objective sample, the presumed cross-sectional shape is determined by using a model base library method.

7. A pattern dimension measurement system comprising:
a plurality of electron microscope devices mutually coupled through a network;
a computer which compares a device parameter database for storing device parameters of each of said plurality of electron microscope devices, a real signal waveform of a pattern of a dimension measurement objective sample obtained by scanning the dimension measurement objective sample through the use of a first electron microscope device representing one of the plurality of electron microscope devices and a simulation waveform library prepared through simulation by using device characteristic parameters of said first electron microscope device stored in said device parameter database, so as to obtain a presumed cross-sectional shape of the pattern of the dimension measurement objective sample, and generates a plurality of simulated signal waveforms corresponding to each of the plurality of electron microscope devices exclusive of said first electron microscope device by using the obtained presumed cross-sectional shape of the dimension measurement objective sample and device characteristic parameters of the individual plurality of electron microscope devices exclusive of said first electron microscope device;

a machine difference database which stores, as machine difference information, the machine differences among the plurality of electron microscope devices inclusive of said first electron microscope calculated on the basis of dimensions of patterns of the plurality of dimension measurement objective samples which are calculated on the basis of each of the plurality of simulated signal waveforms generated by the computer and also on the basis of dimensions of the pattern of the dimension measurement objective samples calculated on the basis of the real signal waveform; and a recipe database stored with a recipe including a process for correcting a dimension measurement result by using the machine difference information stored in the machine difference database.

8. A pattern dimension measurement system according to claim 7, wherein the recipe including the process of correcting results of dimension measurement by using said machine difference information is prepared by selecting an item of execution of machine difference correction on a GUI for recipe preparation of said computer.

* * * * *